US012701803B2

(12) United States Patent
Takashino

(10) Patent No.: US 12,701,803 B2
(45) Date of Patent: Aug. 4, 2026

(54) BACK-ILLUMINATED IMAGING DEVICE WITH BACKSIDE ELECTRODE LAYER AND ELECTRONIC APPARATUS THEREOF

(71) Applicant: SONY SEMICONDUCTOR SOLUTIONS CORPORATION, Kanagawa (JP)

(72) Inventor: Hiroyuki Takashino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 457 days.

(21) Appl. No.: 18/548,885

(22) PCT Filed: Mar. 2, 2022

(86) PCT No.: PCT/JP2022/008874
§ 371 (c)(1),
(2) Date: Sep. 1, 2023

(87) PCT Pub. No.: WO2022/190993
PCT Pub. Date: Sep. 15, 2022

(65) Prior Publication Data
US 2024/0170516 A1     May 23, 2024

(30) Foreign Application Priority Data
Mar. 11, 2021     (JP) ................................. 2021-039261

(51) Int. Cl.
*H10F 39/00*     (2025.01)
*H10F 39/18*     (2025.01)
(52) U.S. Cl.
CPC ....... *H10F 39/8057* (2025.01); *H10F 39/182* (2025.01)

(58) Field of Classification Search
CPC .. H10F 39/8037; H10F 39/018; H10F 39/182; H10F 39/1843; H10F 39/809;
(Continued)

(56) References Cited

U.S. PATENT DOCUMENTS

| 10,944,943 | B2* | 3/2021 | Kim | H10F 39/807 |
| 2015/0002713 | A1* | 1/2015 | Nomura | H10F 39/807 |
| | | | | 348/302 |

(Continued)

FOREIGN PATENT DOCUMENTS

| JP | 2011-159757 A | 8/2011 |
| JP | 2016-152417 A | 8/2016 |

(Continued)

OTHER PUBLICATIONS

International Search Report and Written Opinion of PCT Application No. PCT/JP2022/008874, issued on May 17, 2022, 12 pages of ISRWO.

*Primary Examiner* — John P. Dulka
(74) *Attorney, Agent, or Firm* — CHIP LAW GROUP

(57)     ABSTRACT
An imaging device includes a semiconductor substrate having a first surface and a second surface that are opposed to each other, a plurality of pixels, and a plurality of photoelectric converters. The plurality of pixels is in a matrix, and the plurality of photoelectric converters generates, through photoelectric conversion, an electric charge corresponding to an amount of received light for each of the pixels, a first isolation section between adjacent pixels of the pixels and electrically and optically isolates the adjacent pixels from each other, a second isolation section between adjacent photoelectric converters in the pixel of the photoelectric converters and electrically isolates the adjacent photoelectric converters from each other, and an electrode layer on side of the first surface of the semiconductor substrate to
(Continued)

extend over adjacent photoelectric converters of the photo-
electric converters.

17 Claims, 34 Drawing Sheets

(58) Field of Classification Search
CPC ...... H10F 39/10; H10F 39/8057; H10F 39/12;
H10F 39/199; H10F 39/807; H10F
39/811; H10F 39/813; G01S 7/4816;
G01S 7/4863; G01S 7/4914; G01S 17/10;
G01S 17/36; H04N 25/57; H04N 25/70
See application file for complete search history.

(56) References Cited

U.S. PATENT DOCUMENTS

| | | |
|---|---|---|
| 2016/0043119 A1 | 2/2016 | Lee et al. |
| 2016/0043130 A1* | 2/2016 | Ohguro ................. H10F 39/812 |
| | | 257/225 |
| 2017/0047367 A1 | 2/2017 | Lee et al. |
| 2018/0063456 A1* | 3/2018 | Lee ...................... H04N 25/133 |
| 2020/0021754 A1 | 1/2020 | Borthakur |

FOREIGN PATENT DOCUMENTS

| | | |
|---|---|---|
| JP | 2018-201015 A | 12/2018 |
| WO | 2019/039013 A1 | 2/2019 |
| WO | 2020/017341 A1 | 1/2020 |

* cited by examiner

[FIG. 1]
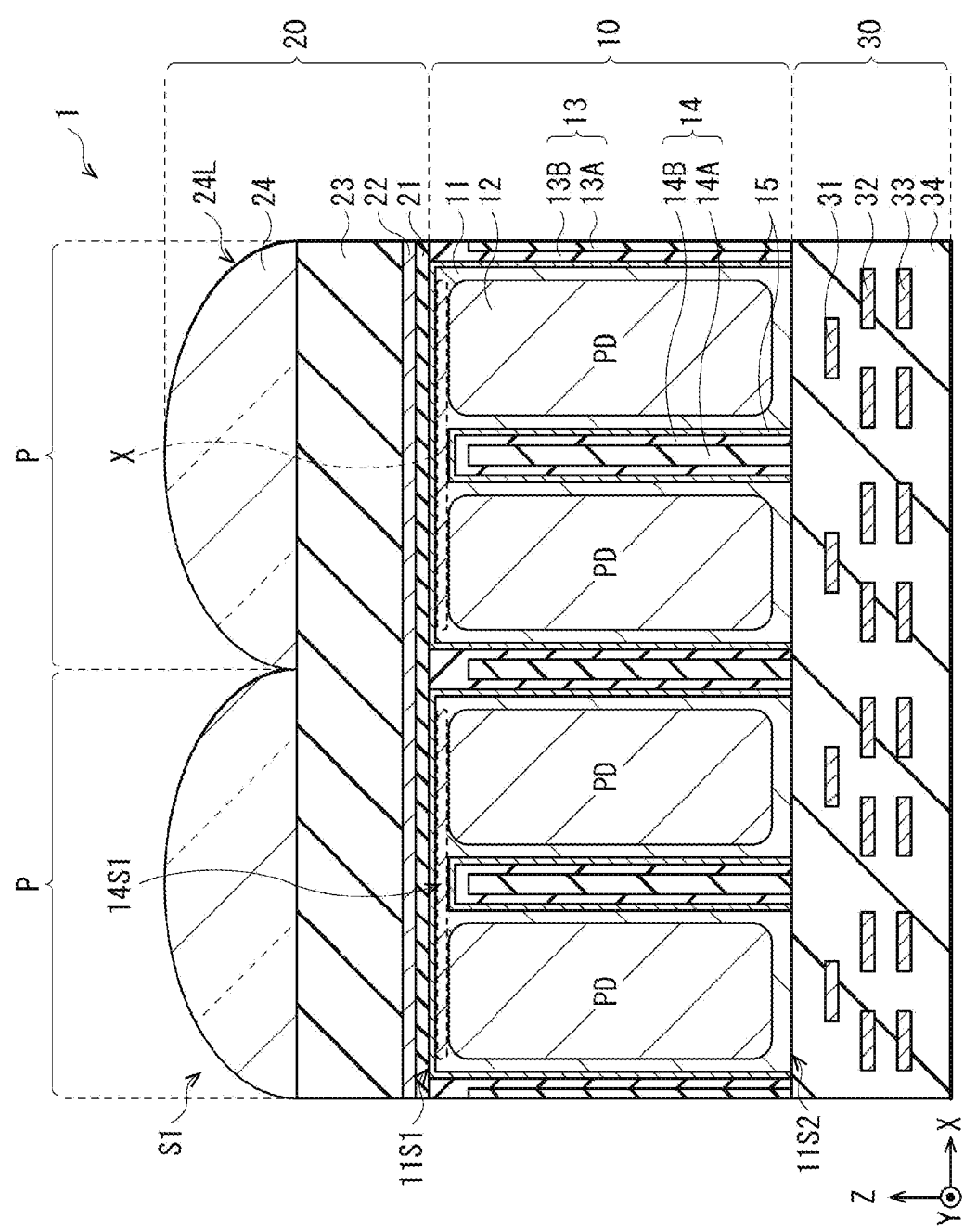

[FIG. 2]
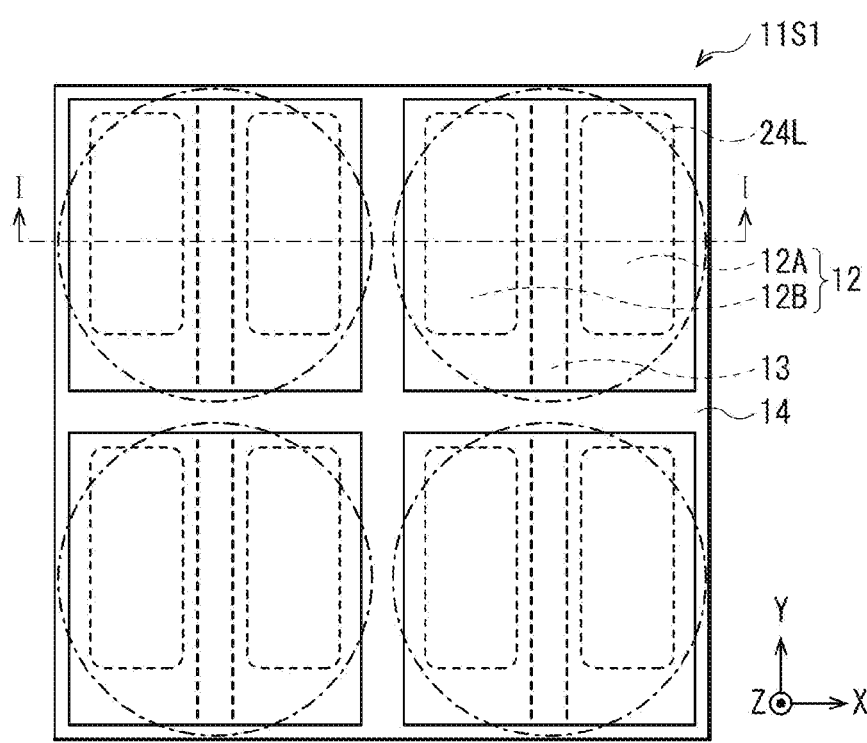
[FIG. 3]
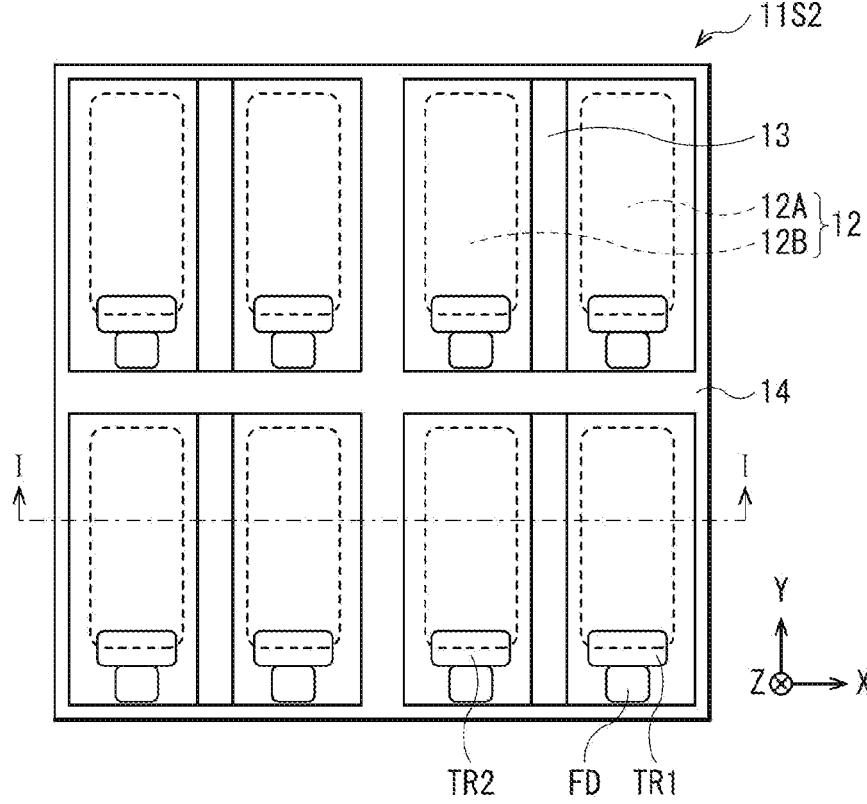

[FIG. 4]
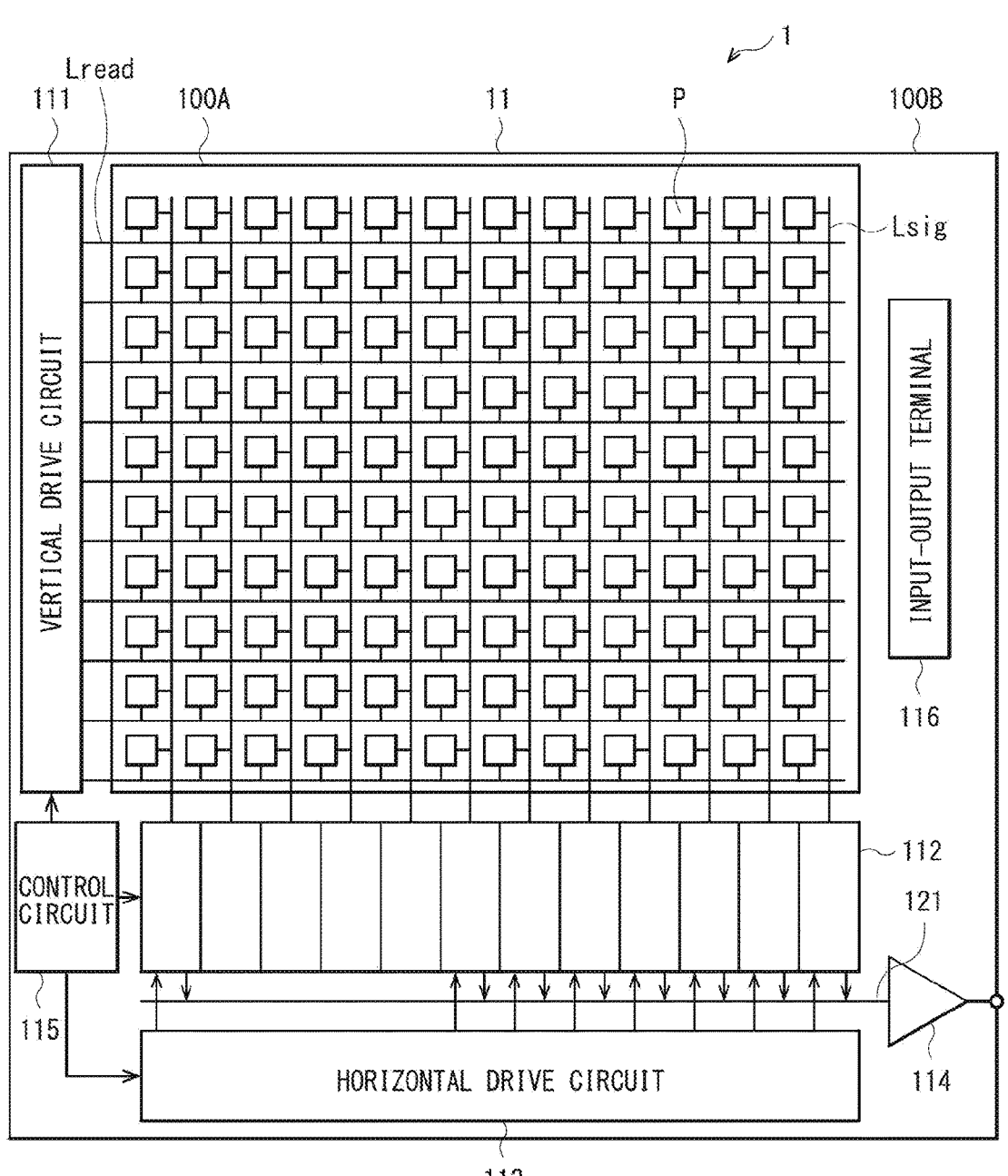

[FIG. 5]
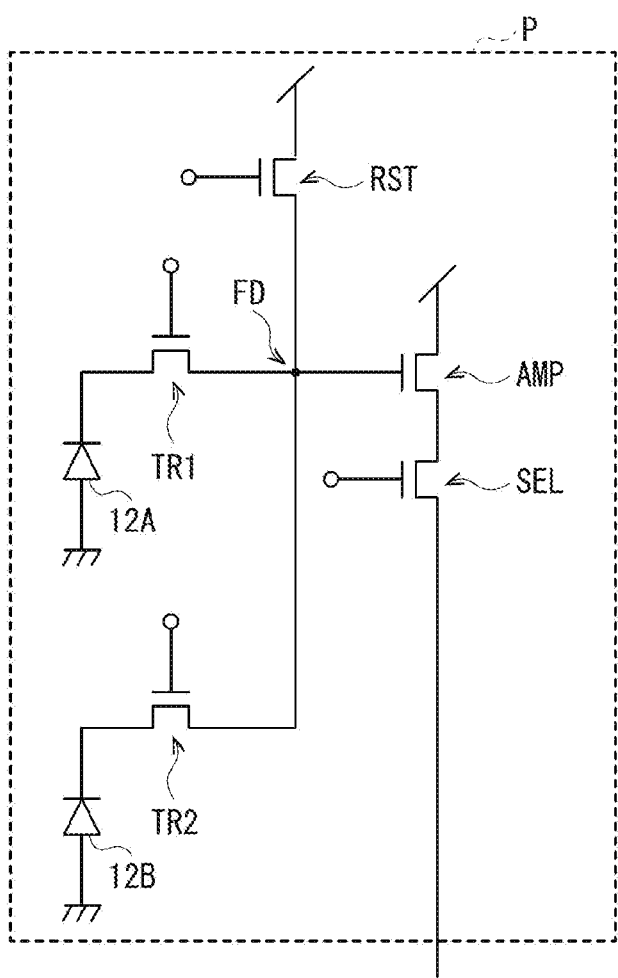

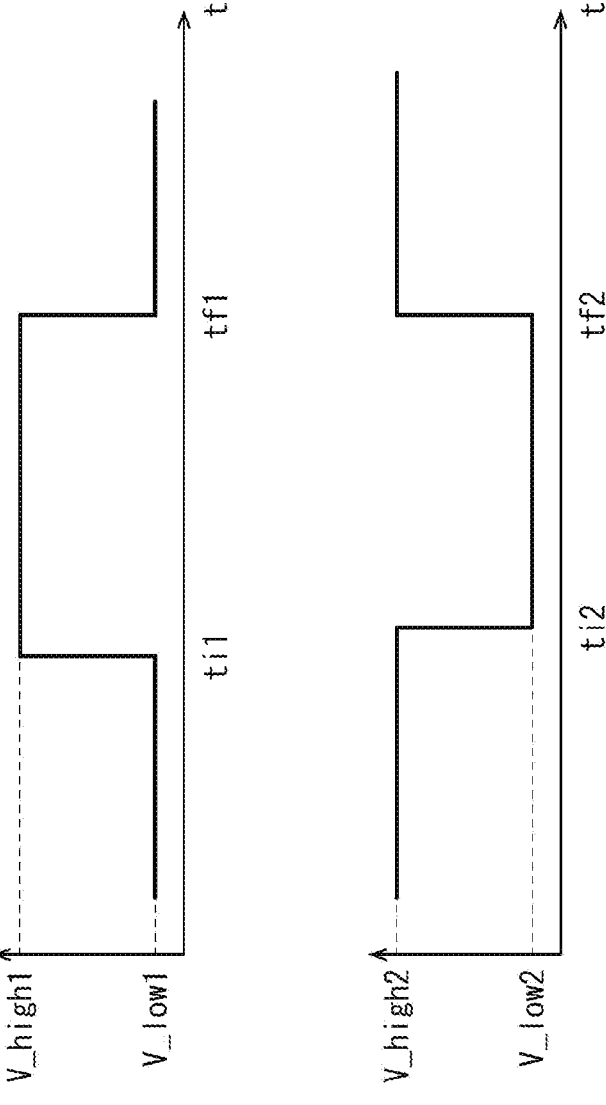
[FIG. 6A]
[FIG. 6B]

[FIG. 7]
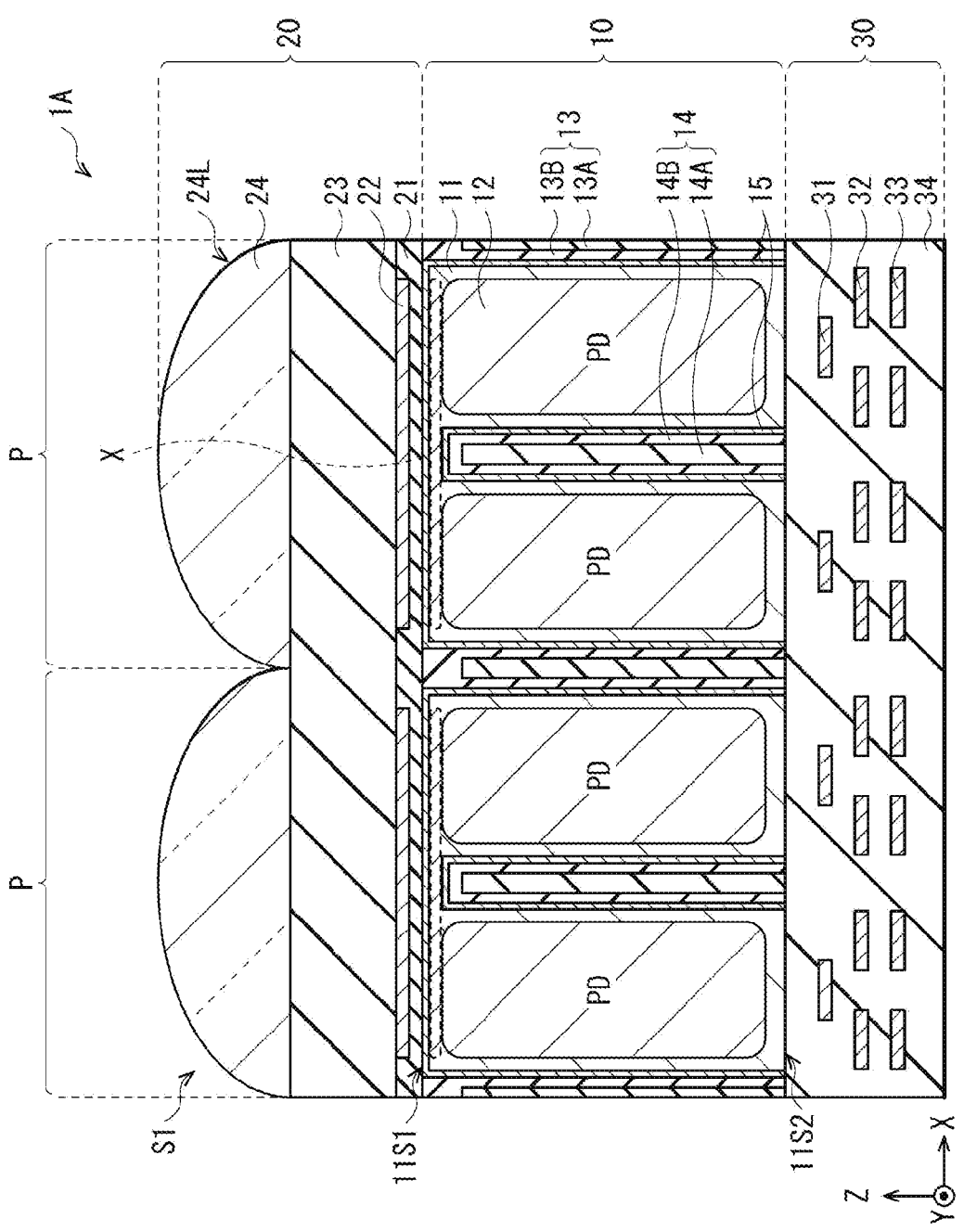

[FIG. 8]
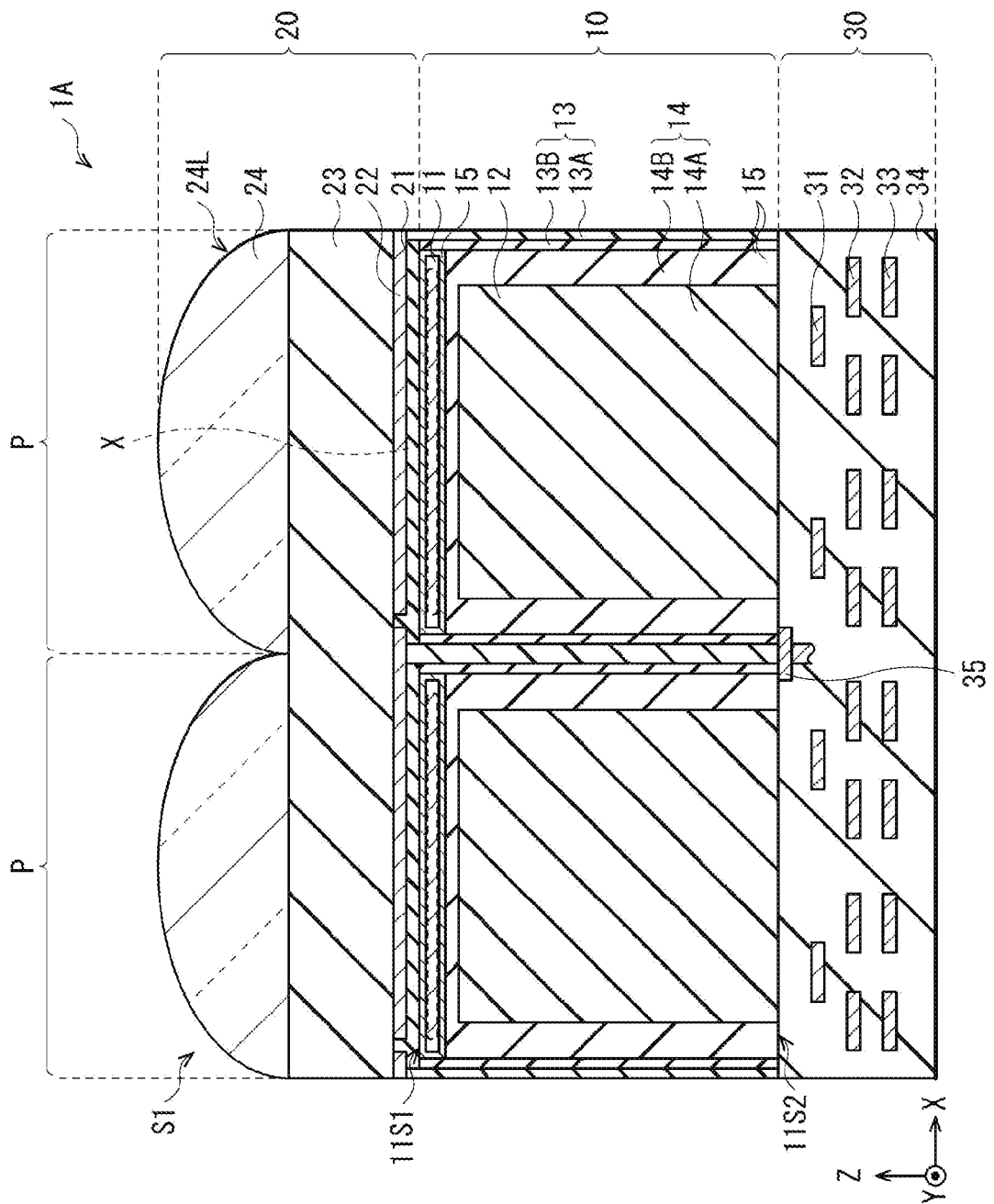

[FIG. 9]
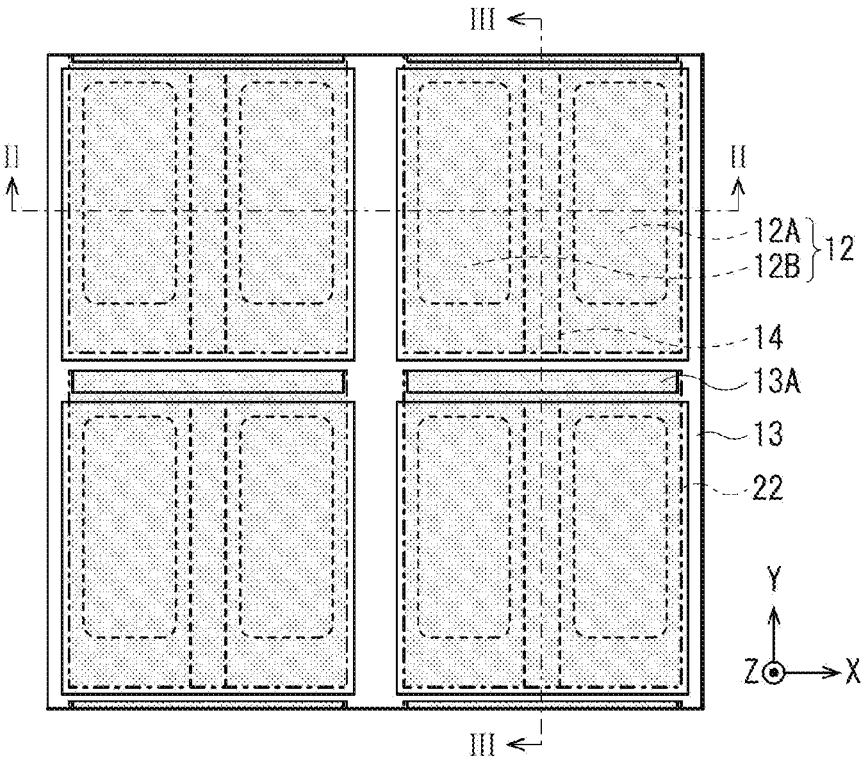

[FIG. 10]
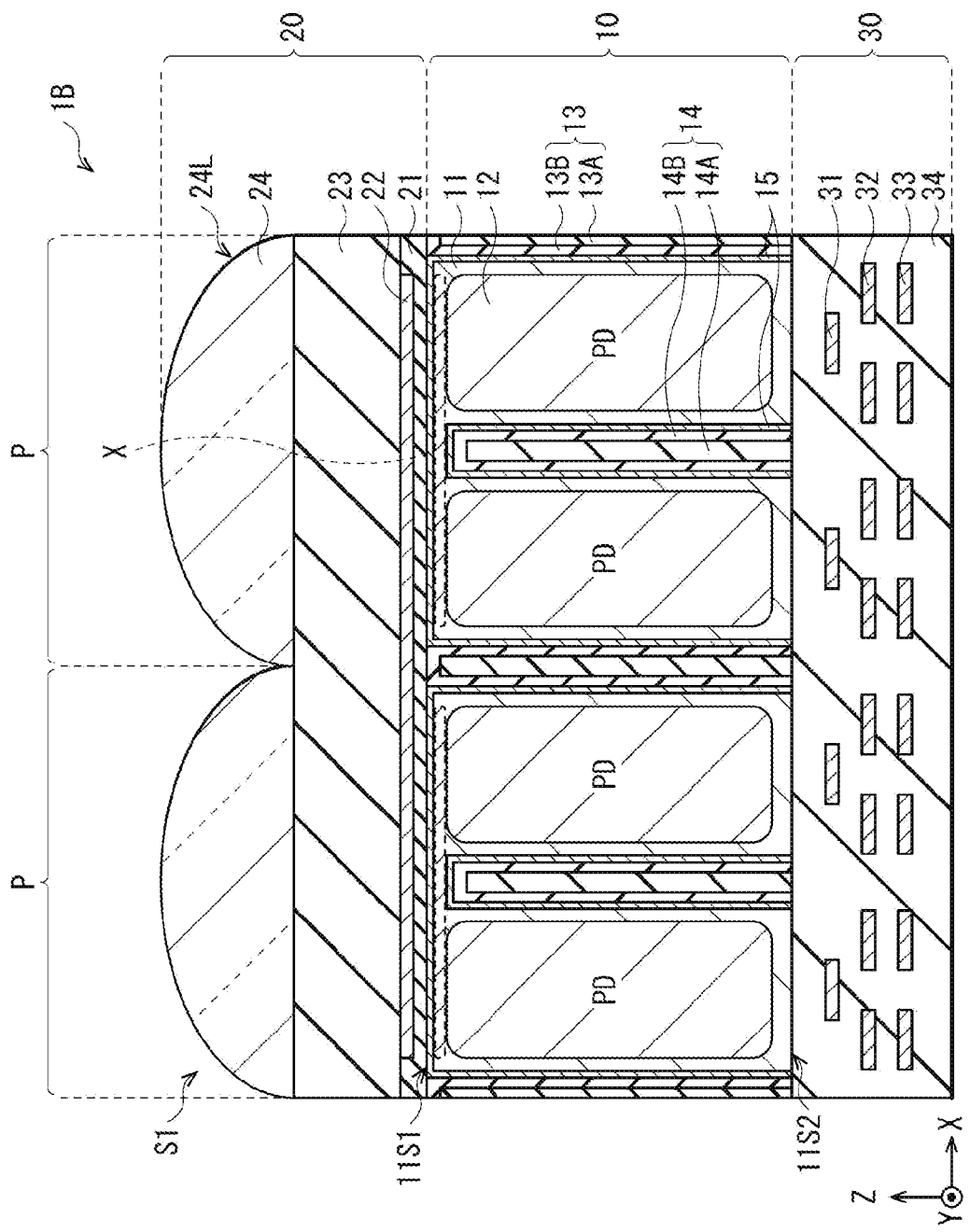

[FIG. 11]
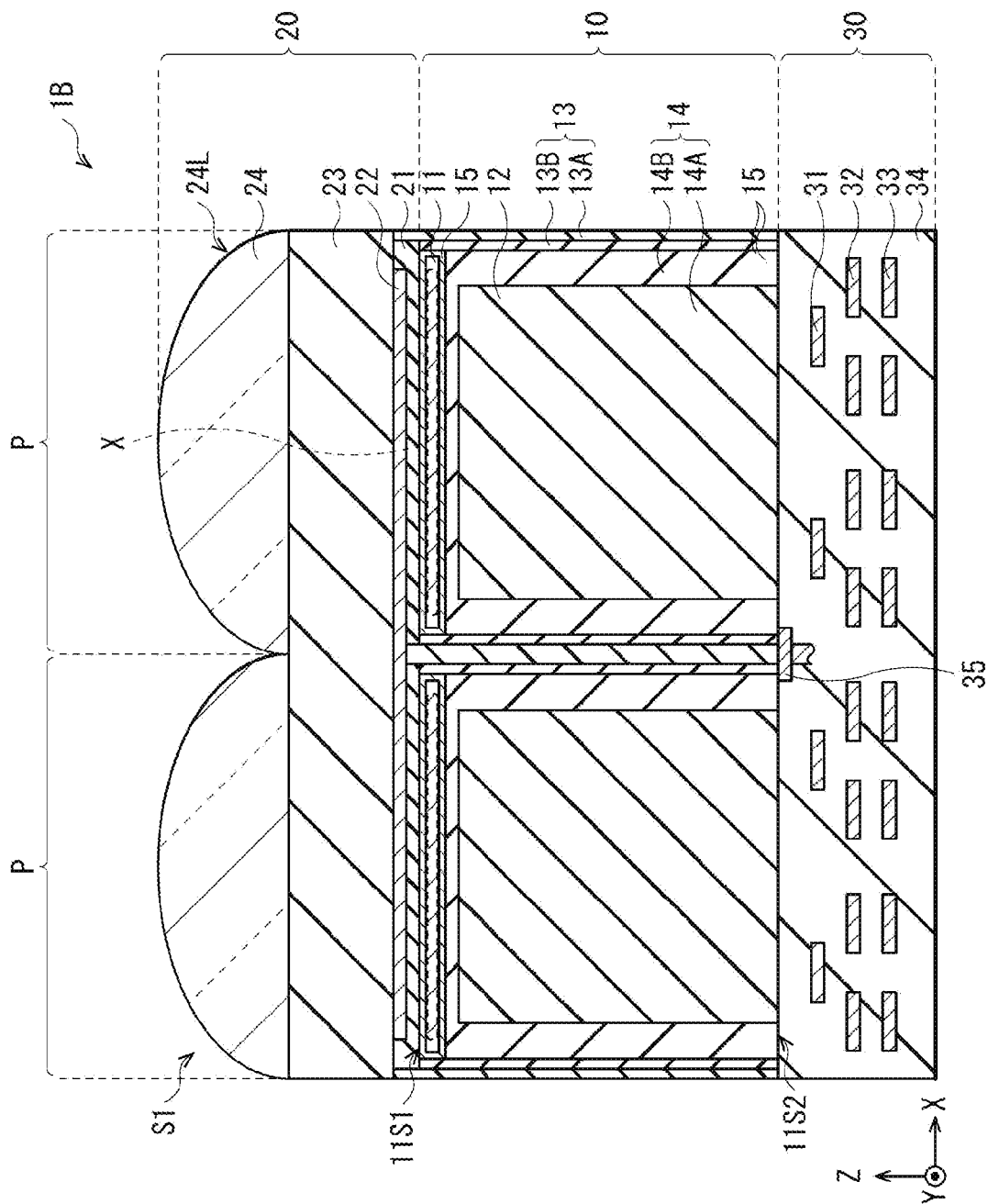

[FIG. 12]
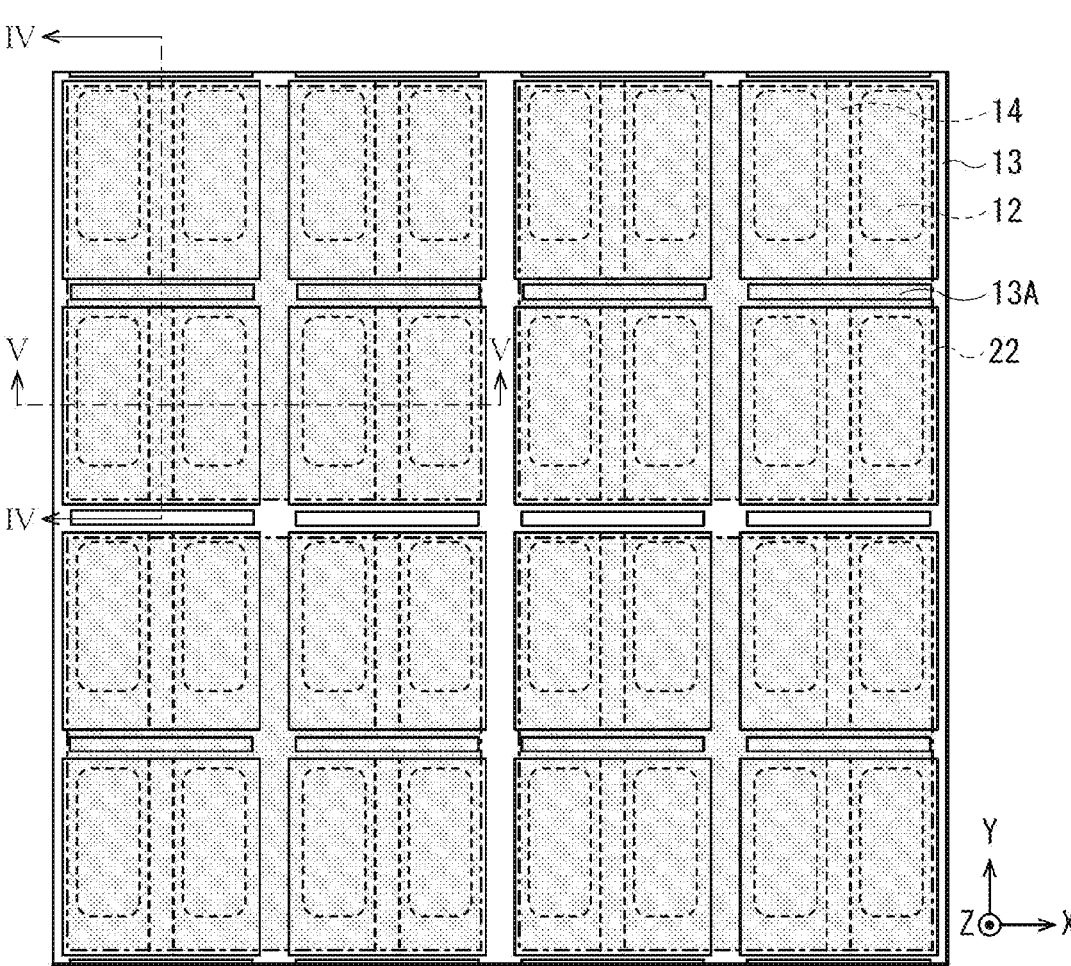

[FIG. 13]
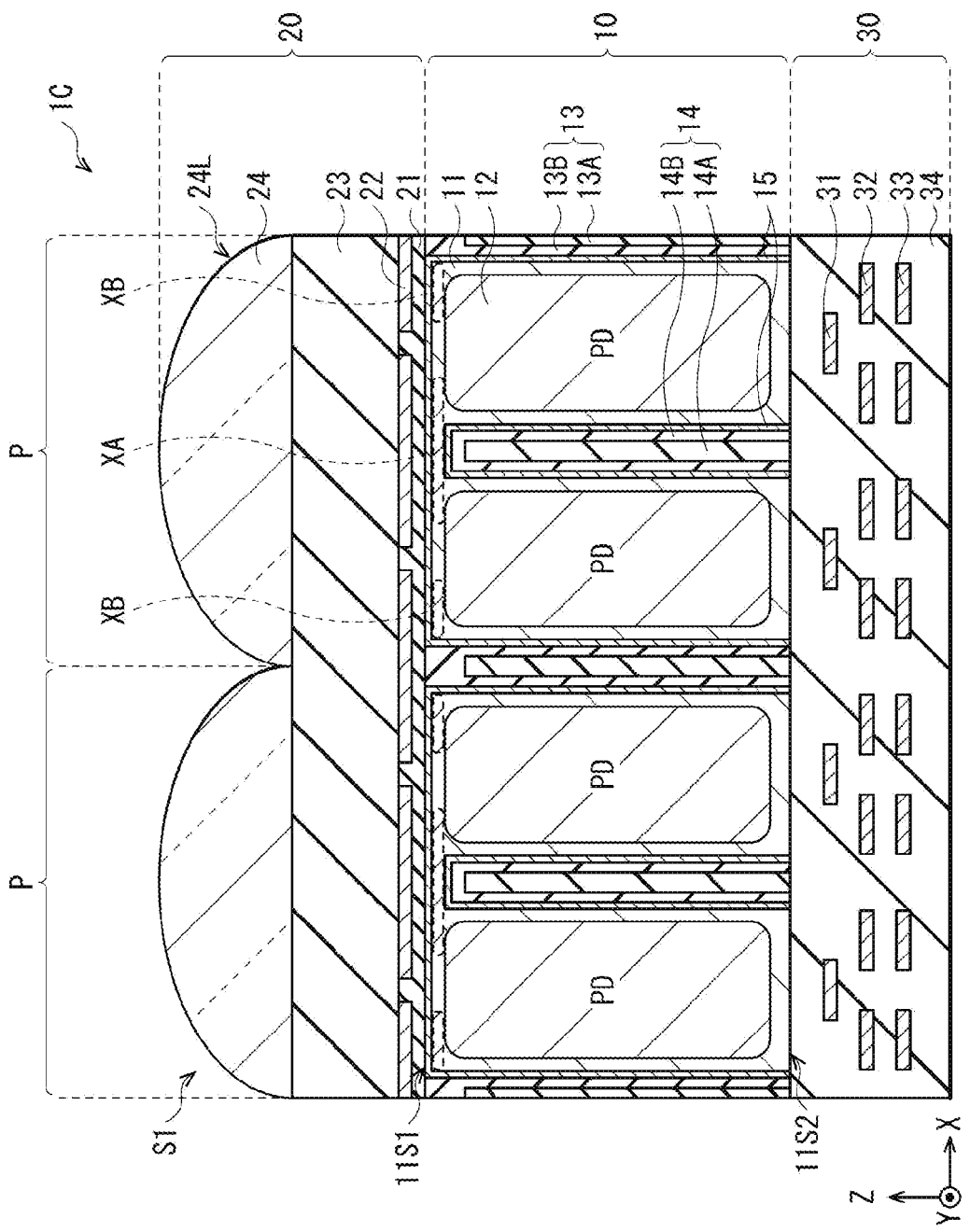

[FIG. 14]
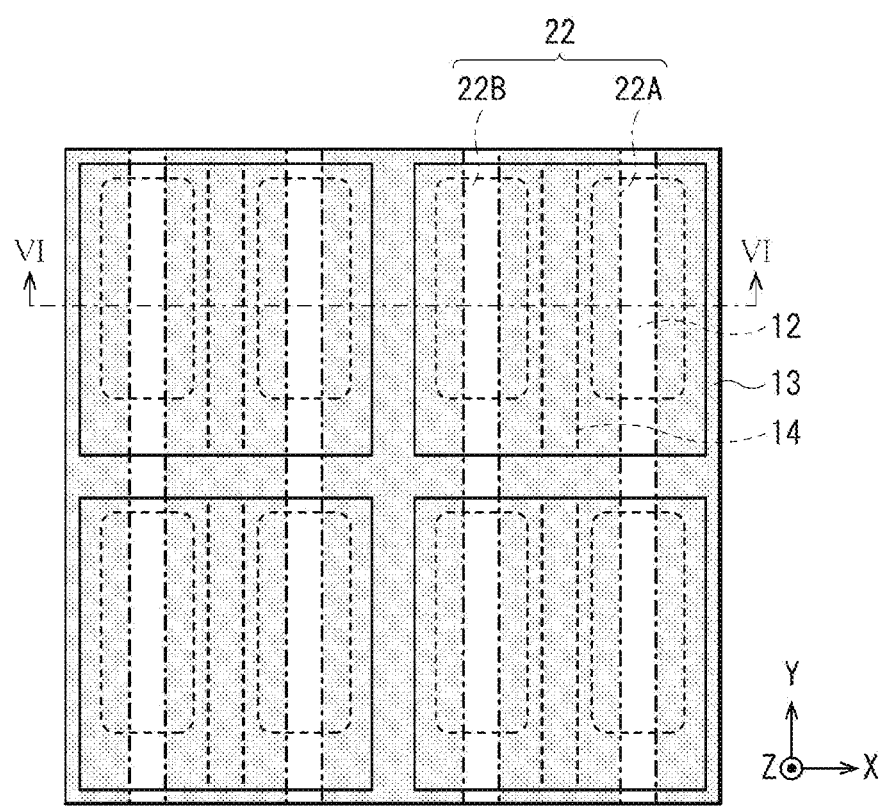

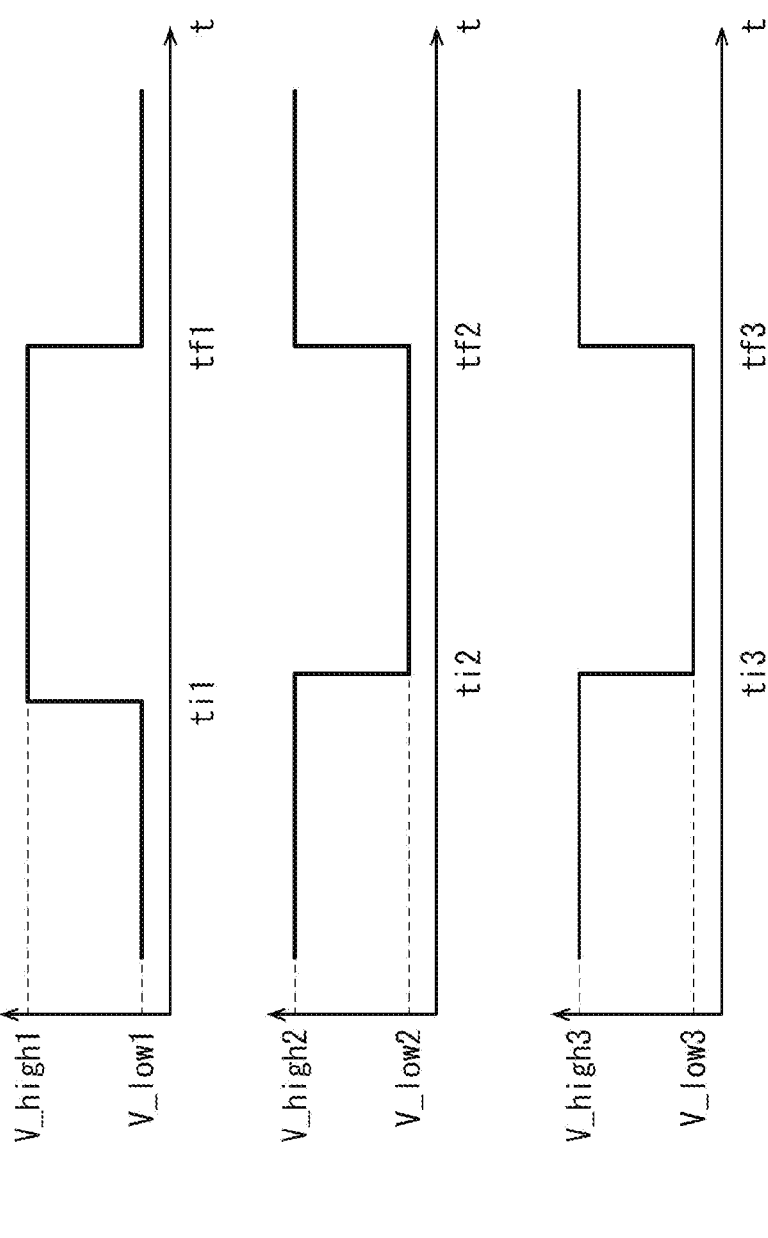
[FIG. 15A]
[FIG. 15B]
[FIG. 15C]

[FIG. 16]
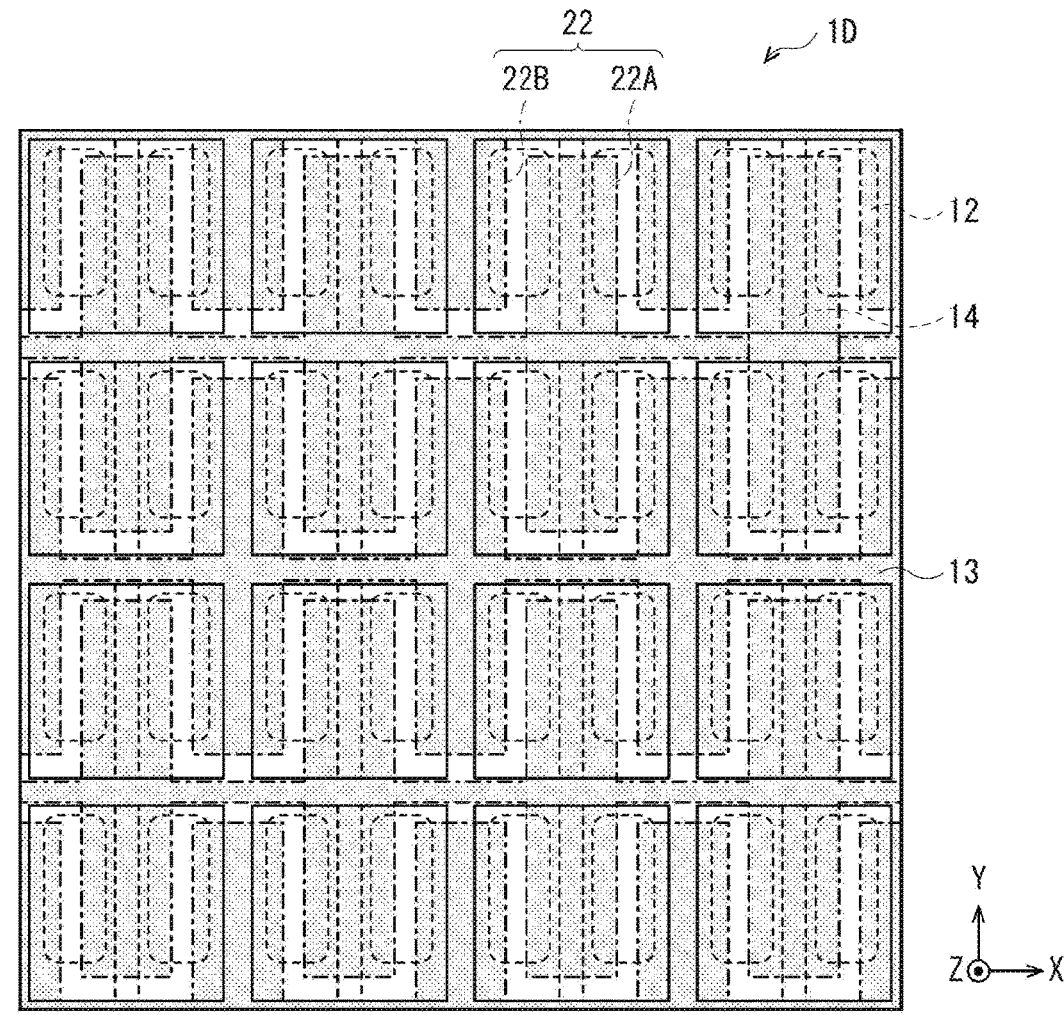

[FIG. 17]
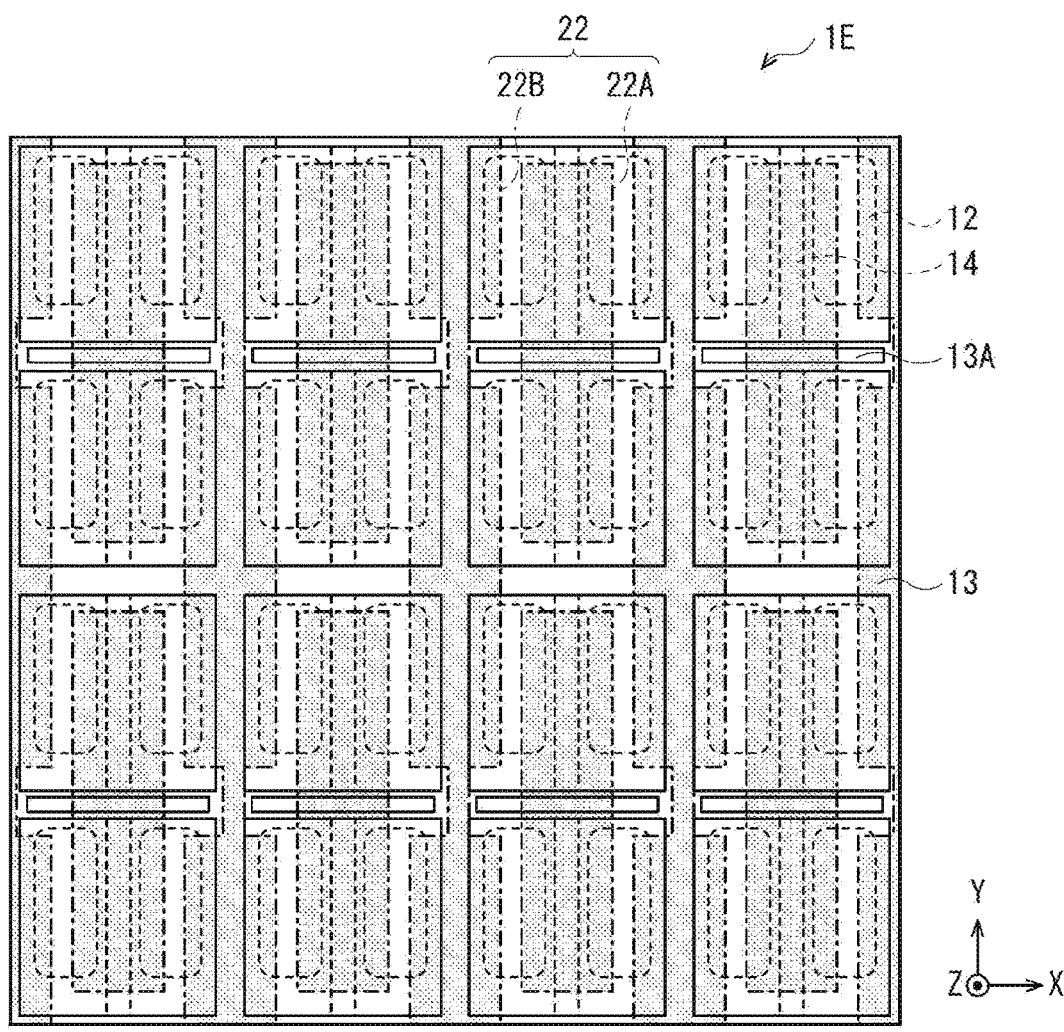

[FIG. 18]
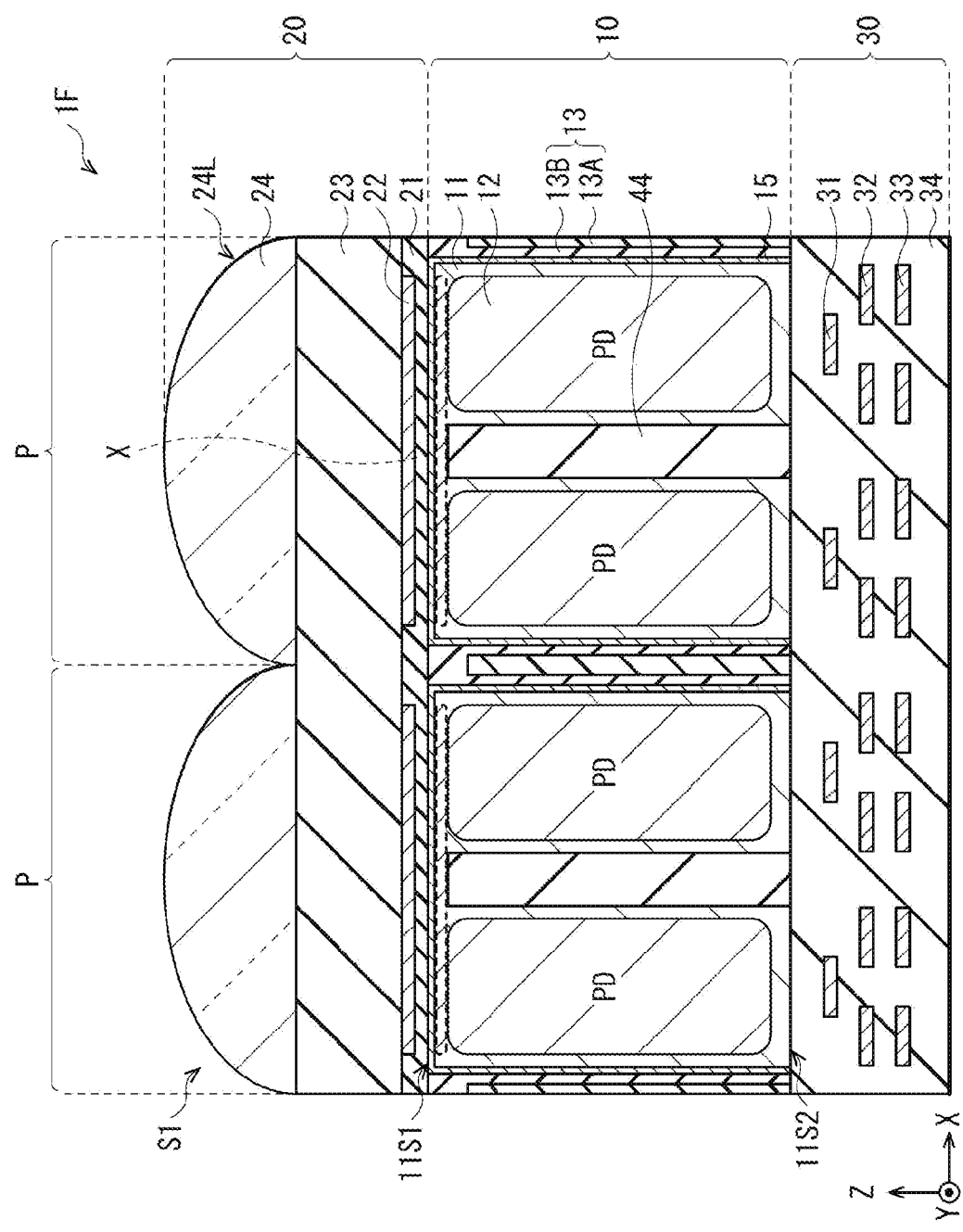

[FIG. 19]
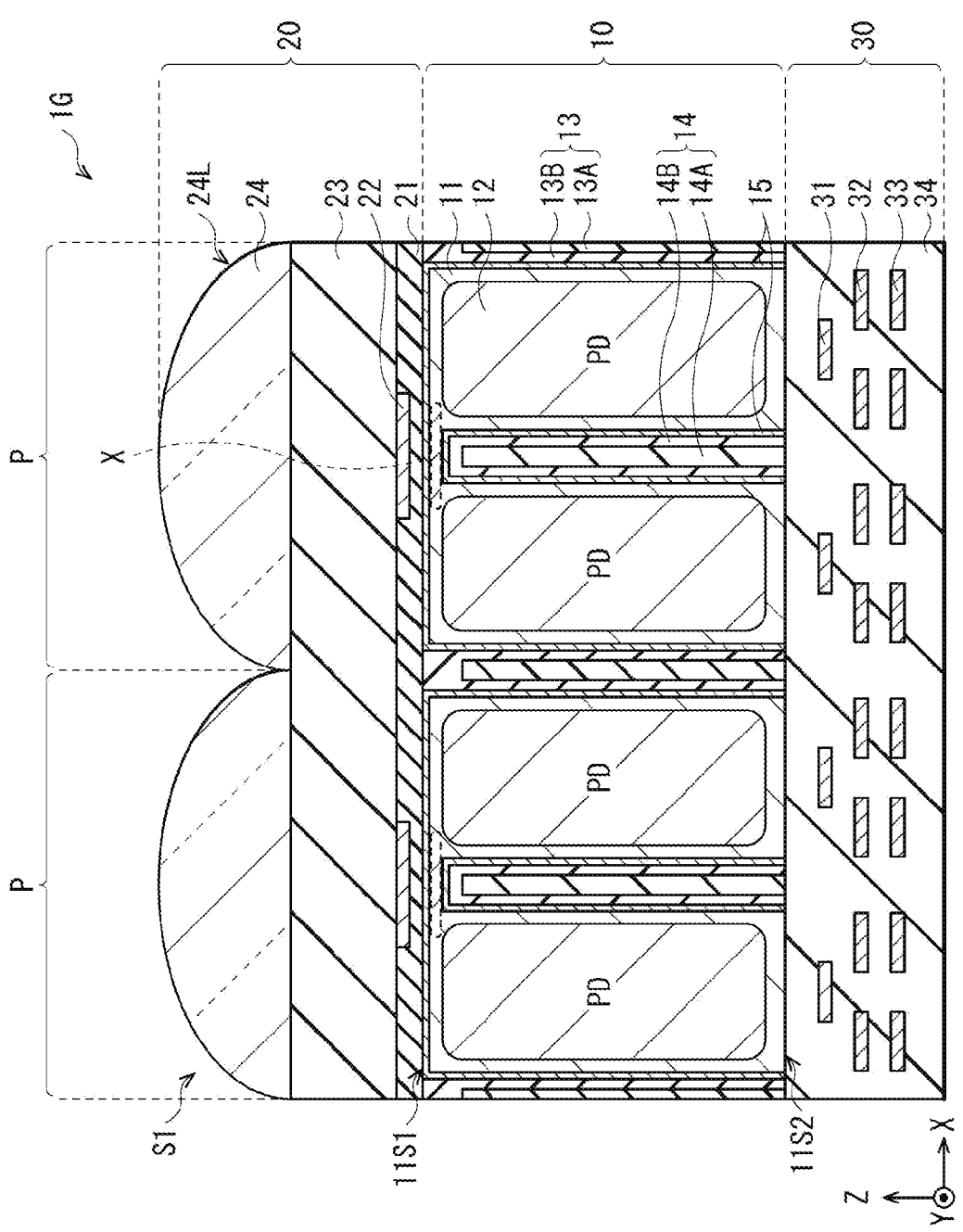

[FIG. 20]
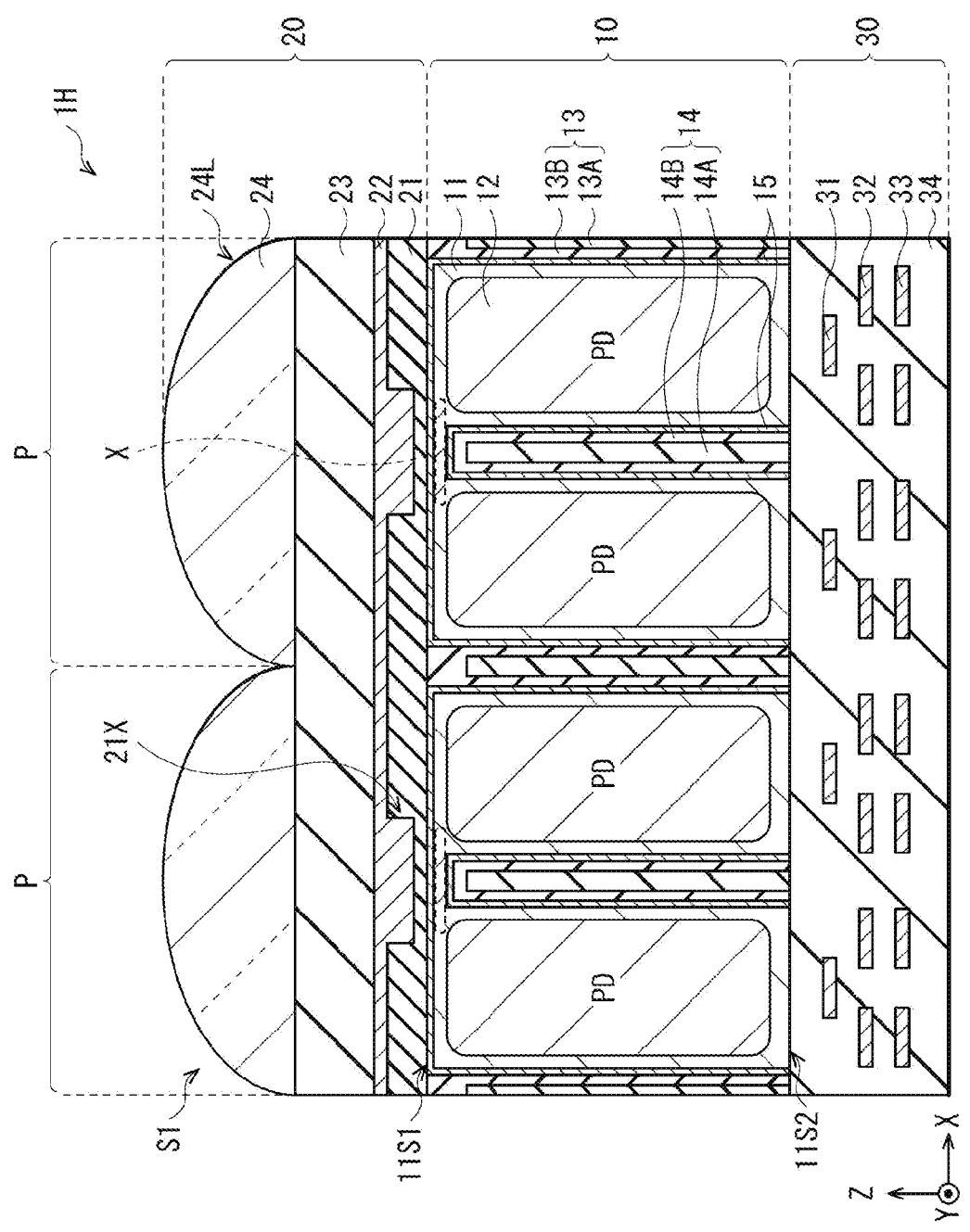

[FIG. 21]
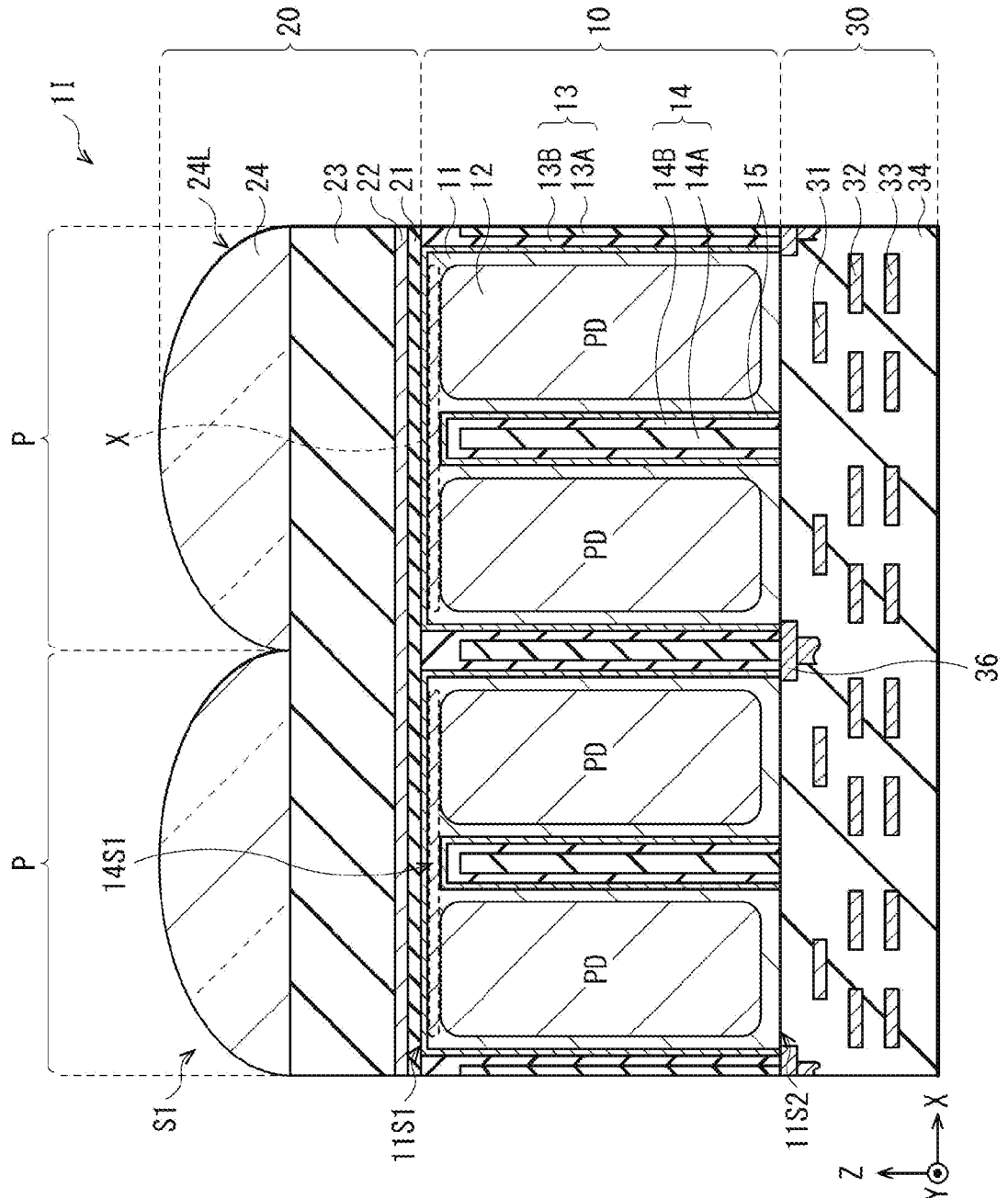

[FIG. 22]
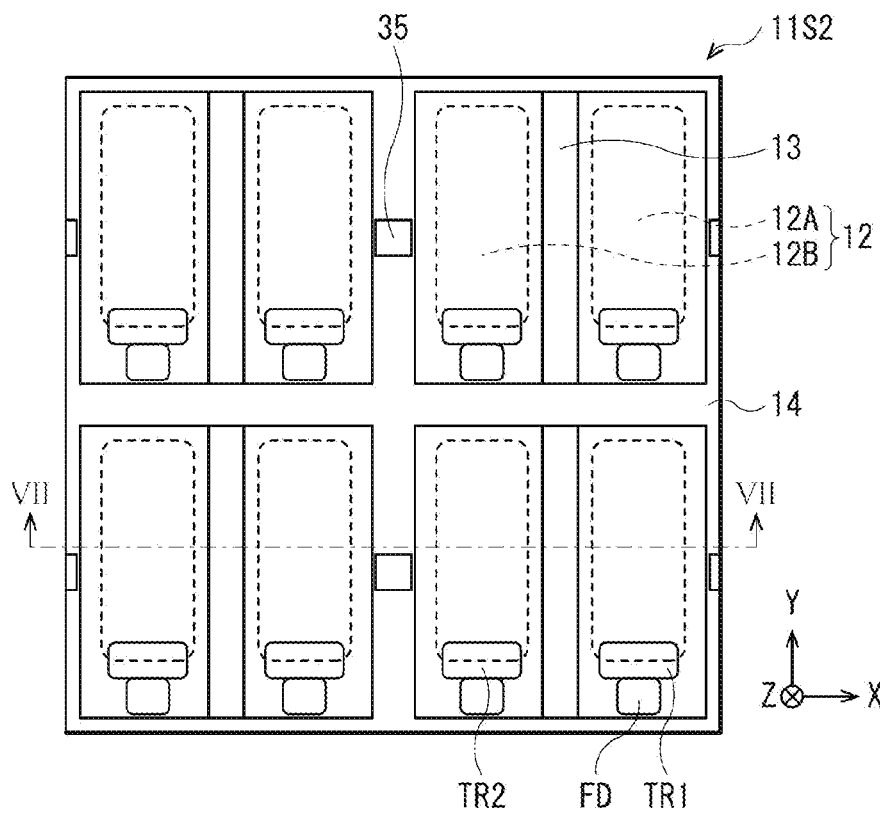

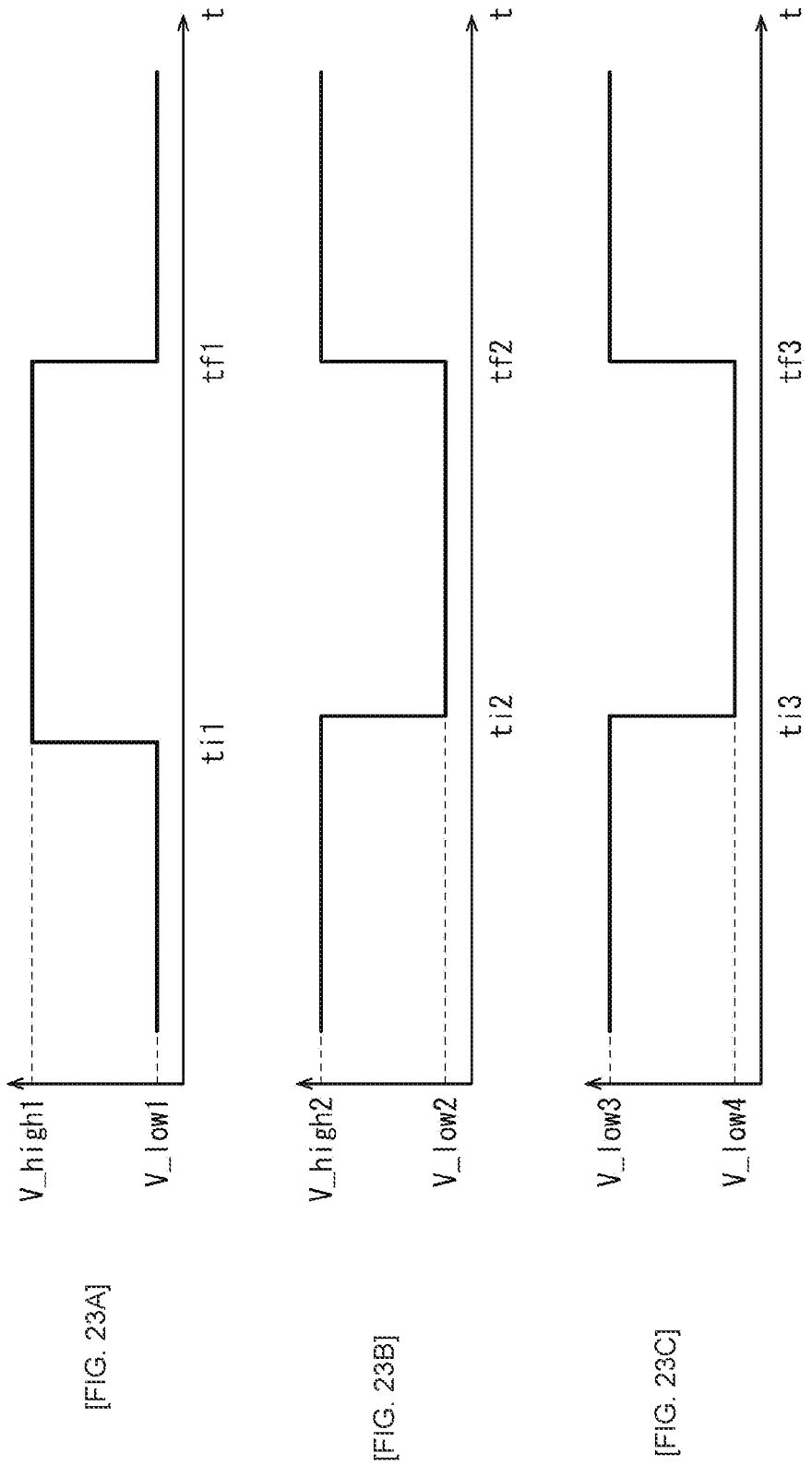
[FIG. 23A]
[FIG. 23B]
[FIG. 23C]

[FIG. 24]
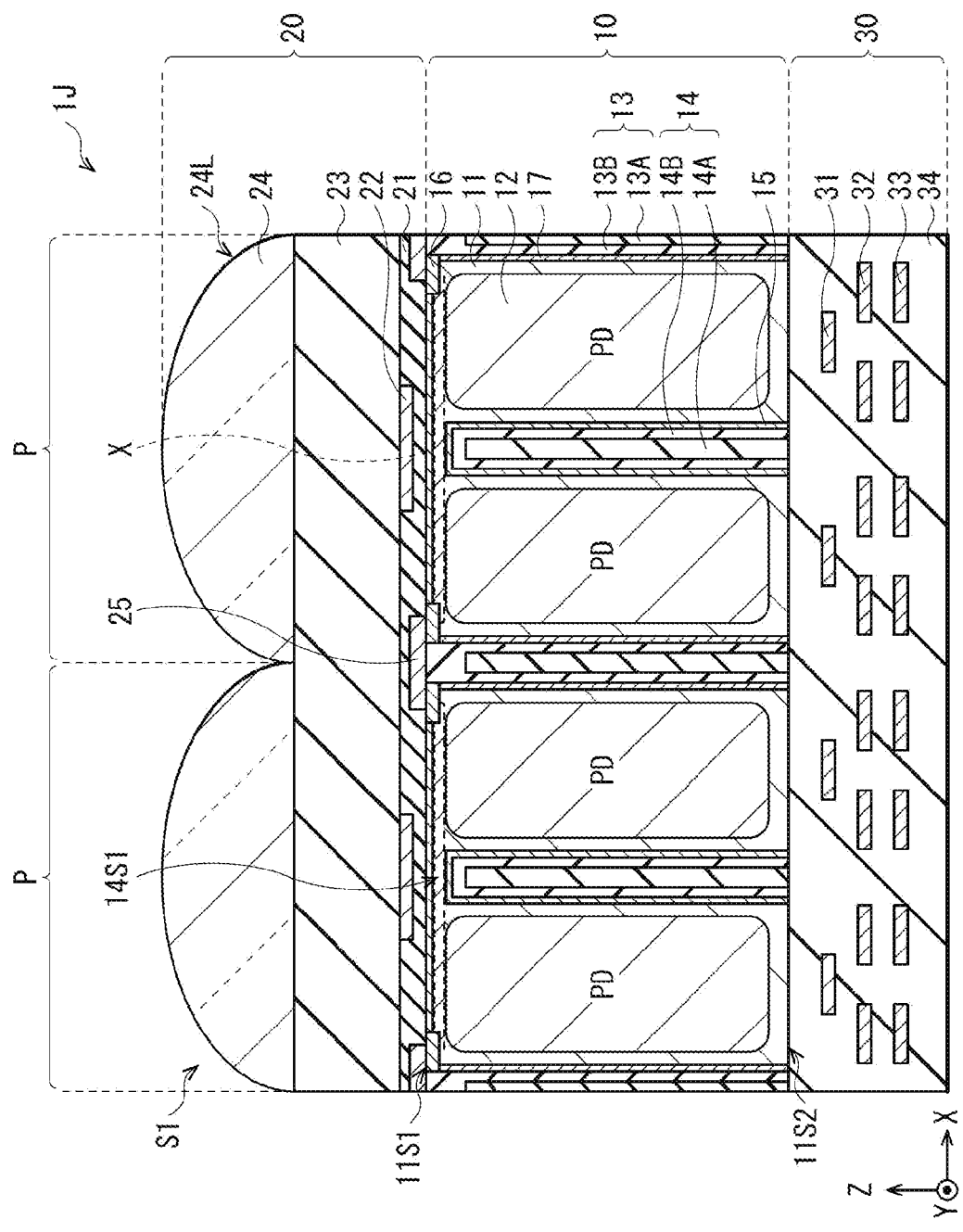

[FIG. 25]
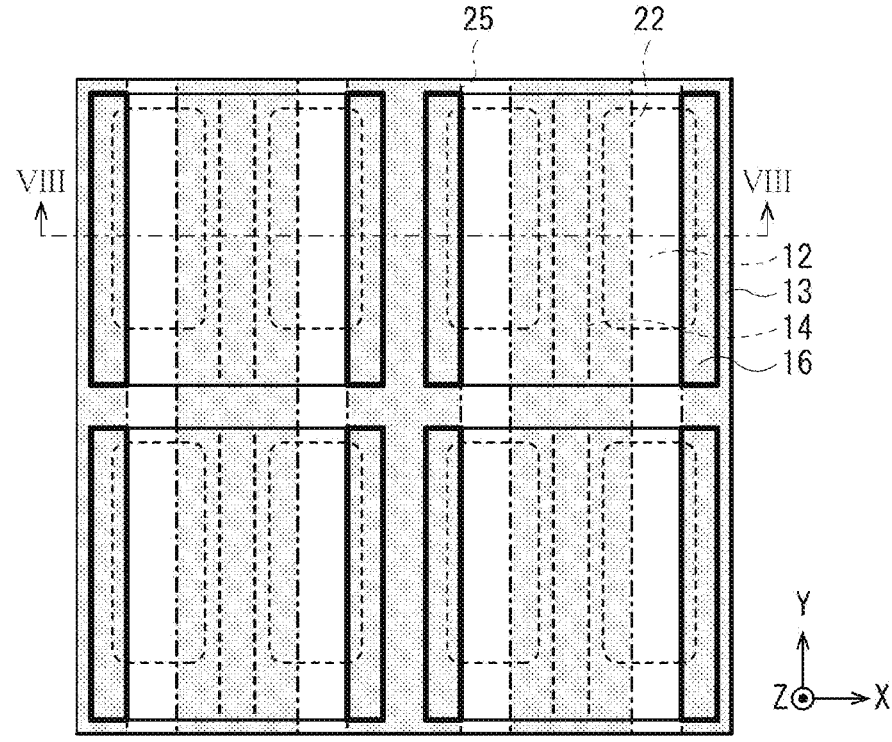

[FIG. 26]
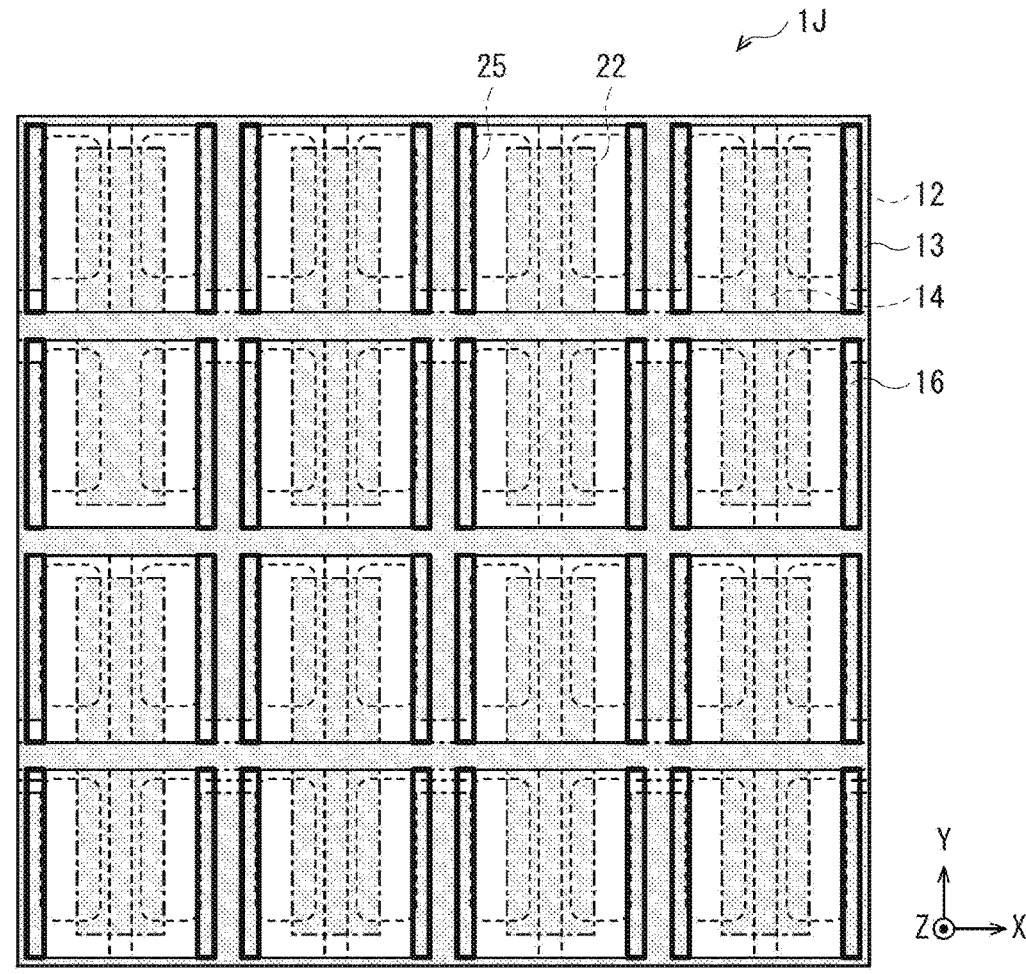

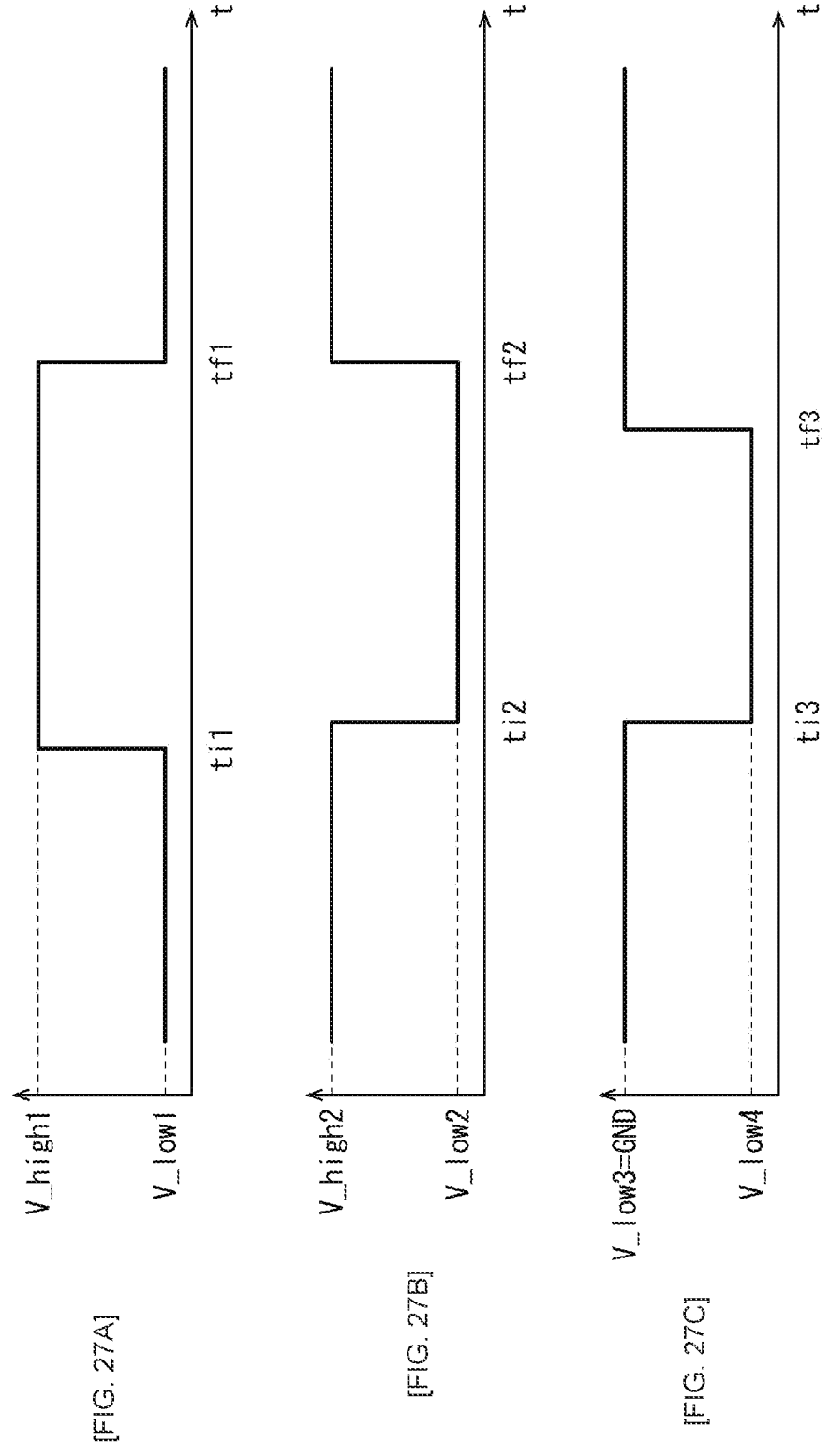
[FIG. 27A]
[FIG. 27B]
[FIG. 27C]

[FIG. 28]
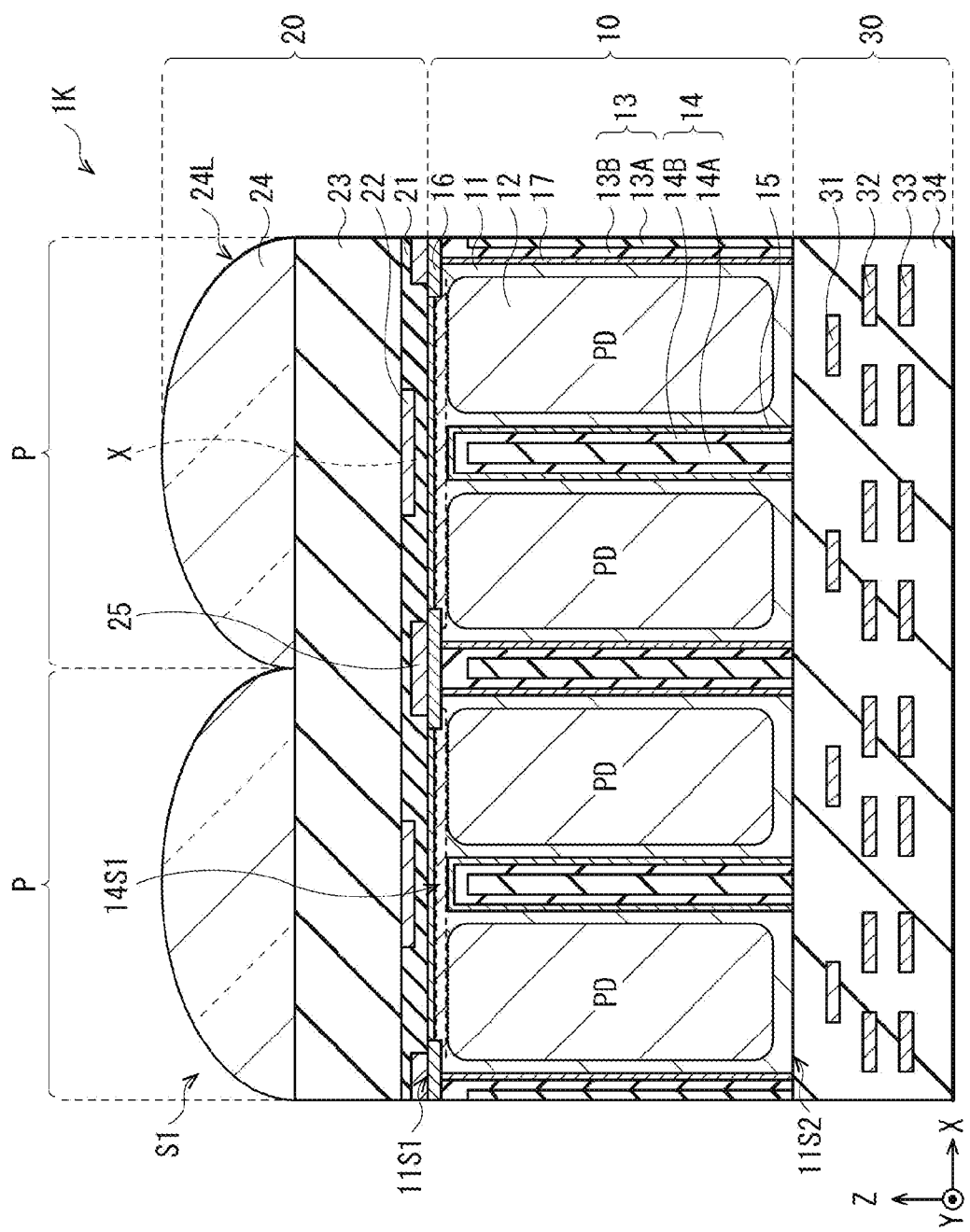

[FIG. 29]
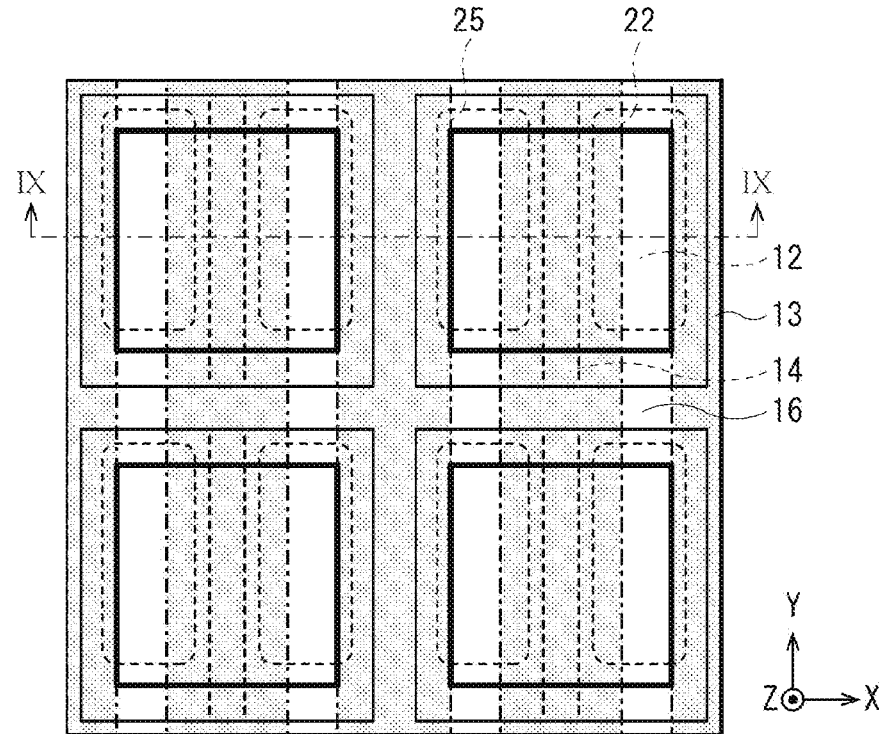

[FIG. 30]
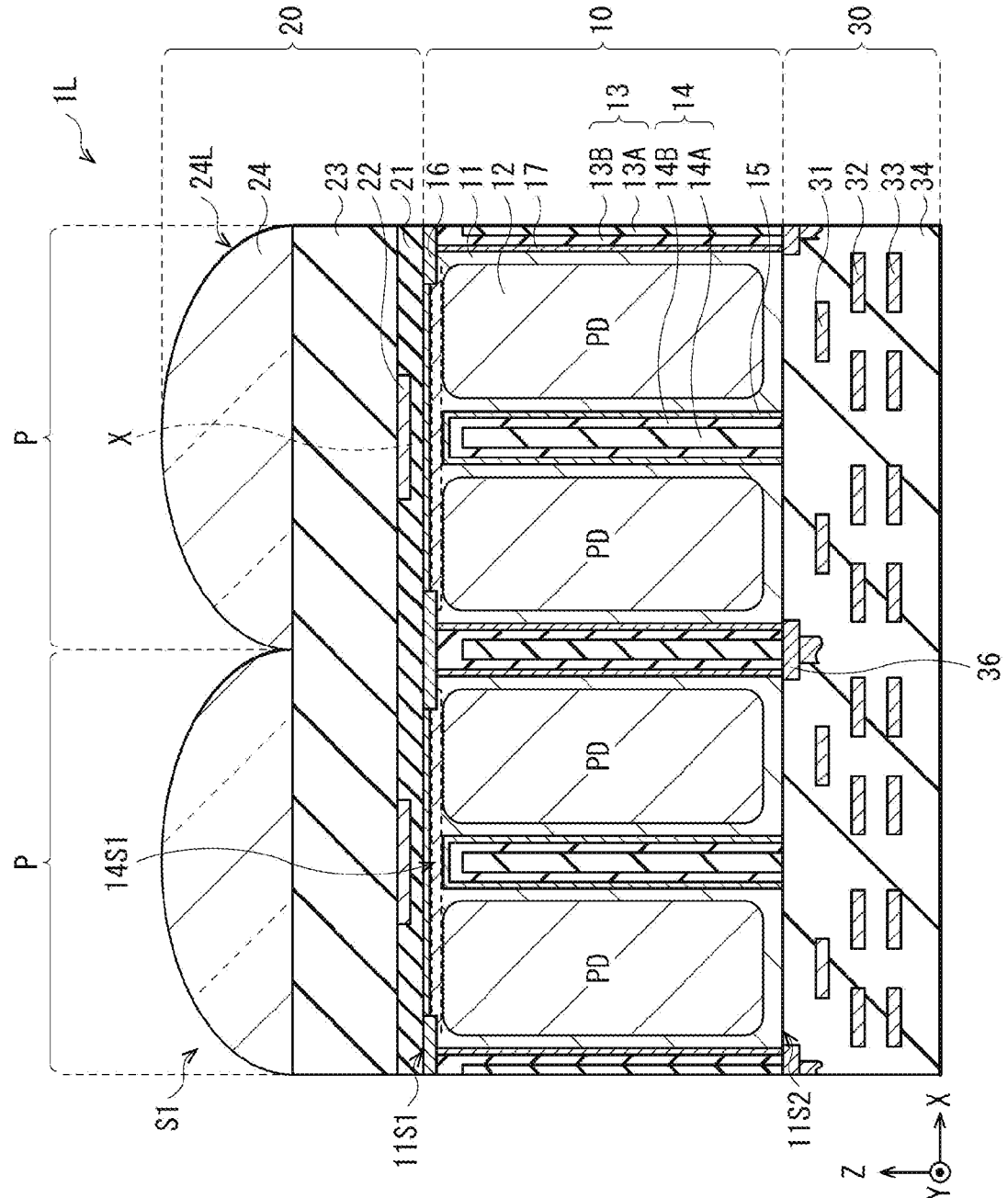

[FIG. 31]
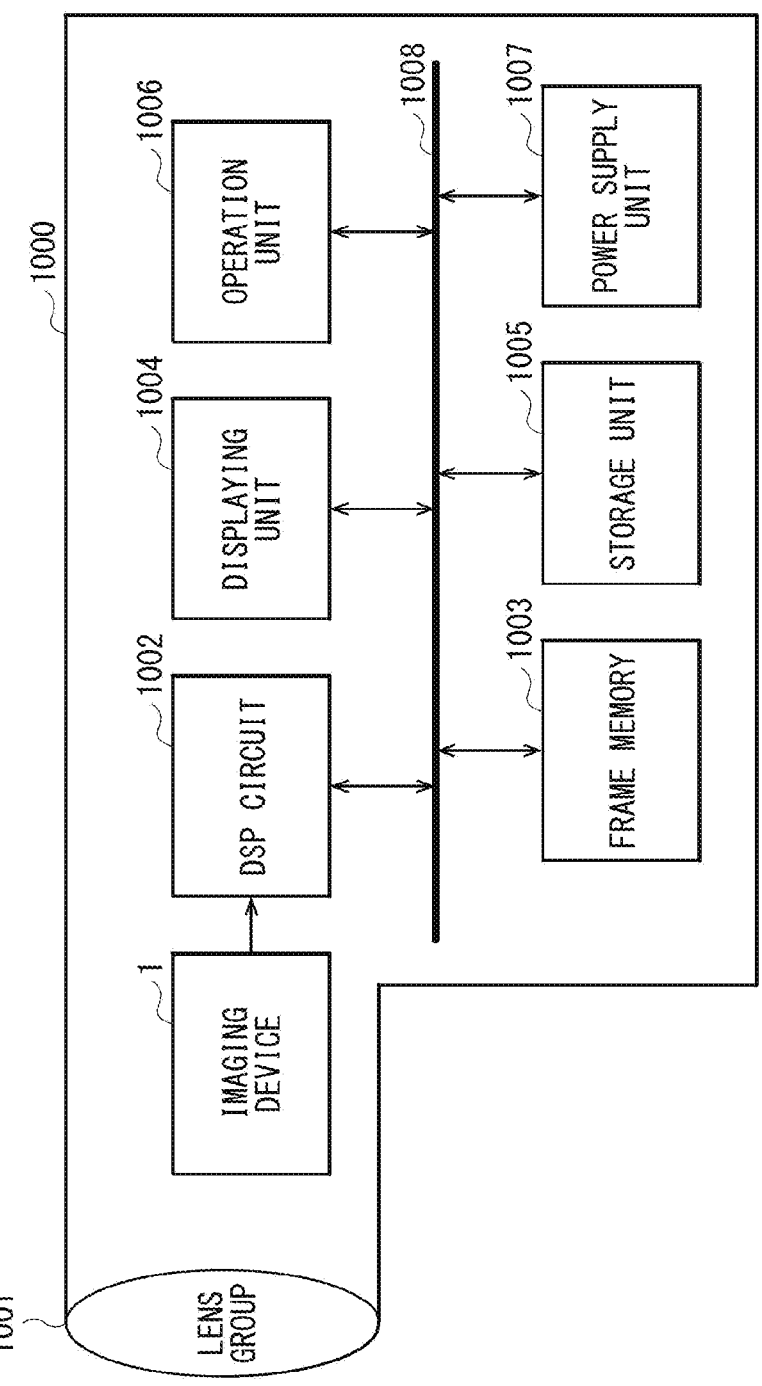

[FIG. 32]
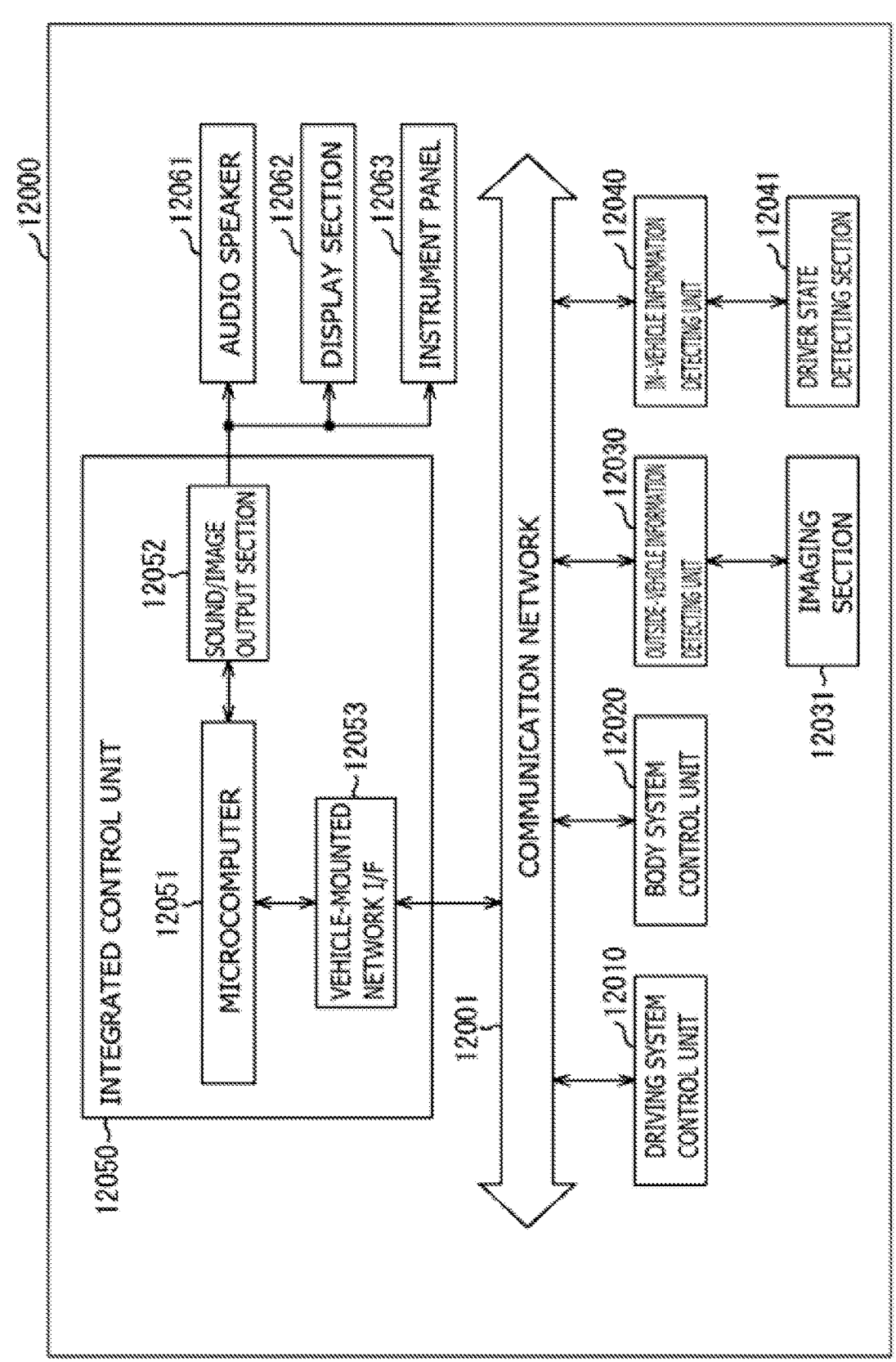

[FIG. 33]
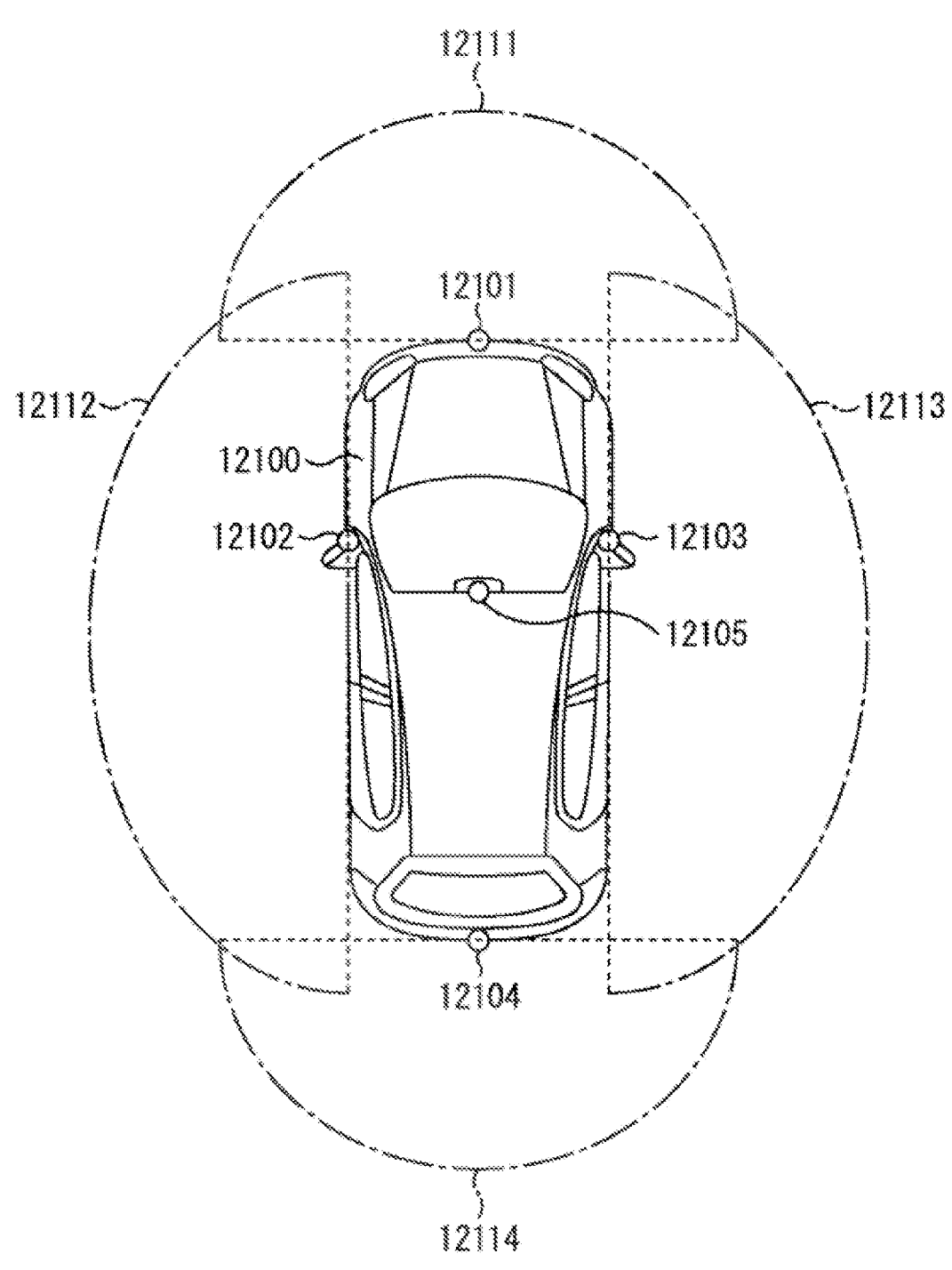

[FIG. 34]
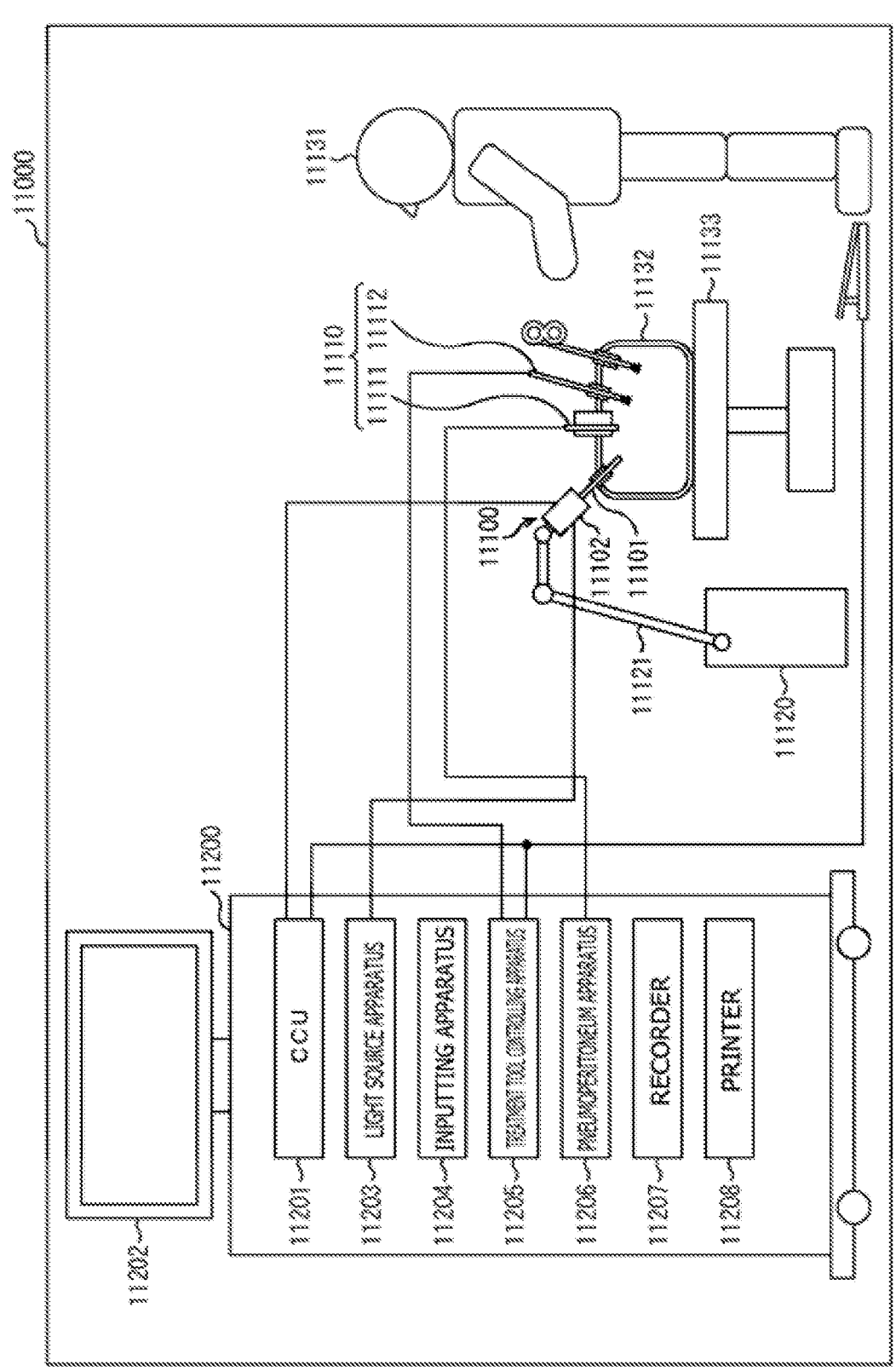

[FIG. 35]
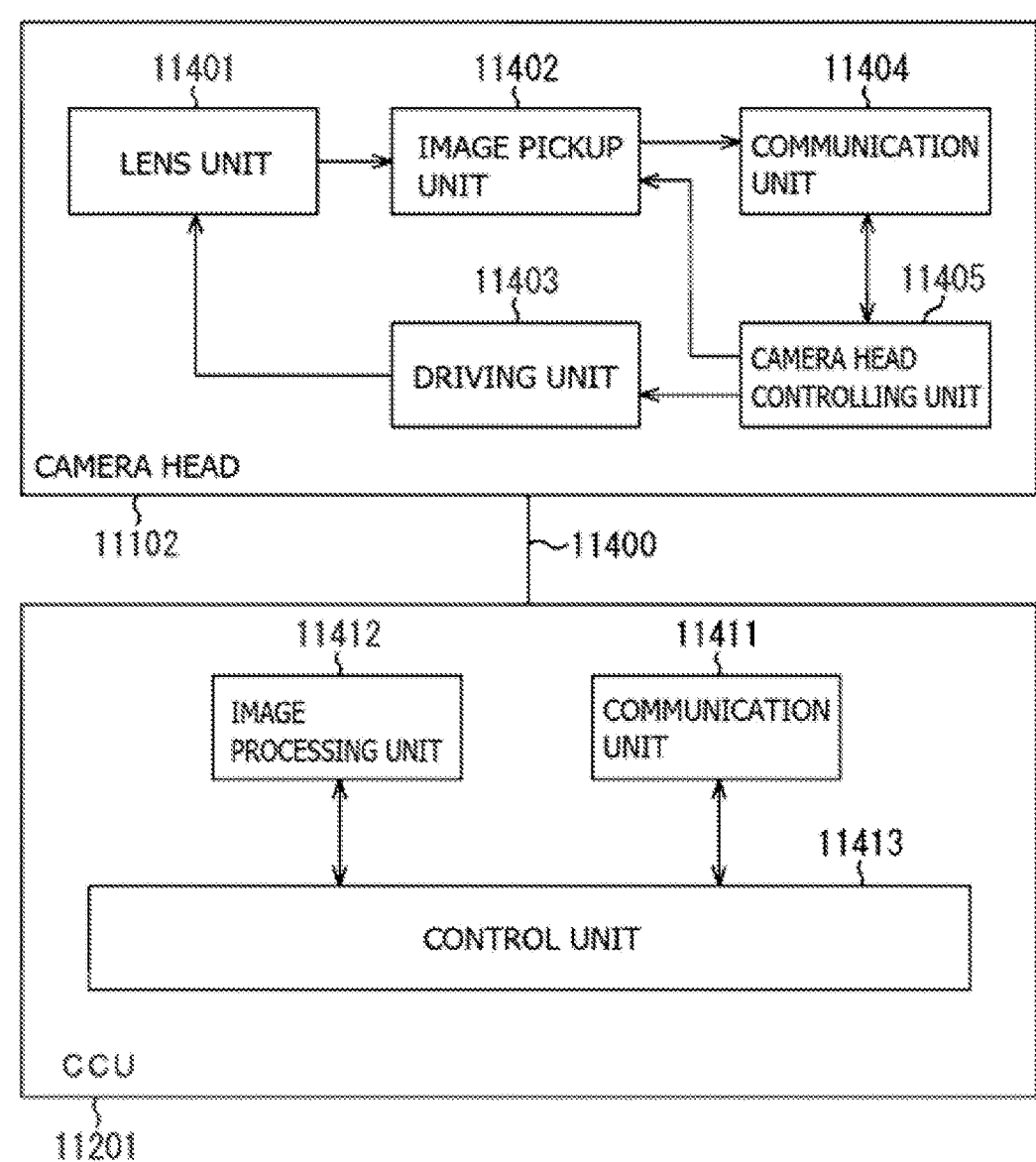

BACK-ILLUMINATED IMAGING DEVICE WITH BACKSIDE ELECTRODE LAYER AND ELECTRONIC APPARATUS THEREOF

CROSS REFERENCE TO RELATED APPLICATIONS

This application is a U.S. National Phase of International Patent Application No. PCT/JP2022/008874 filed on Mar. 2, 2022, which claims priority benefit of Japanese Patent Application No. JP 2021-039261 filed in the Japan Patent Office on Mar. 11, 2021. Each of the above-referenced applications is hereby incorporated herein by reference in its entirety.

TECHNICAL FIELD

The present disclosure relates, for example, to an imaging device that makes it possible to acquire imaging information and parallax information, and also to an electronic apparatus that includes the imaging device.

BACKGROUND ART

For example, PTL 1 discloses a solid-state imaging device including a pixel array unit in which a plurality of pixels is arrayed in a two-dimensional manner. The pixels include a pixel including a plurality of photoelectric conversion devices formed for one on-chip lens. In the solid-state imaging device, a portion of at least one of an inter-pixel isolation section or an inter-pixel light blocking section formed between pixels protrudes toward a center of the pixel in a projecting shape to form a projection portion.

CITATION LIST

Patent Literature

PTL 1: Japanese Unexamined Patent Application Publication No. 2018-201015

SUMMARY OF THE INVENTION

Incidentally, for an imaging device that makes it possible to acquire imaging information and parallax information, it is demanded to improve imaging performance.

It is desirable to provide an imaging device that makes it possible to improve imaging performance, and an electronic apparatus.

An imaging device according to an embodiment of the present disclosure includes: a semiconductor substrate having a first surface and a second surface that are opposed to each other, and including a plurality of pixels and a plurality of photoelectric converters, the plurality of pixels disposed in a matrix, and the plurality of photoelectric converters that generates, through photoelectric conversion, an electric charge corresponding to an amount of received light for each of the pixels; a first isolation section that is provided between adjacent pixels of the pixels and electrically and optically isolates the adjacent pixels from each other; a second isolation section that is provided between adjacent photoelectric converters in the pixel of the photoelectric converters and electrically isolates the adjacent photoelectric converters from each other; and an electrode layer provided on side of the first surface of the semiconductor substrate to extend over adjacent photoelectric converters of the photoelectric converters.

An electronic apparatus according to an embodiment of the present disclosure includes the imaging device according to the embodiment of the present disclosure.

In the imaging device according to the embodiment of the present disclosure and the electronic apparatus according to the embodiment of the present disclosure, the electrode layer that extends over the adjacent photoelectric converters is provided on light incident surface (first surface) side of the semiconductor substrate. On the semiconductor substrate, the plurality of pixels each including a plurality of photoelectric converters is disposed in a matrix. The semiconductor substrate further includes the first isolation section between the adjacent pixels and the second isolation section between the adjacent photoelectric converters in the pixel. With this configuration, an inversion region (or a weak inversion region) is formed near the first surface of the semiconductor substrate between the adjacent photoelectric converters in the pixel, as necessary.

BRIEF DESCRIPTION OF THE DRAWINGS

FIG. 1 is a schematic cross-sectional view of one example of a configuration of an imaging device according to an embodiment of the present disclosure.

FIG. 2 is a schematic plan view of a configuration on first surface side of a semiconductor substrate of the imaging device illustrated in FIG. 1.

FIG. 3 is a schematic plan view of a configuration on second surface side of the semiconductor substrate of the imaging device illustrated in FIG. 1.

FIG. 4 is a block diagram illustrating an entire configuration of the imaging device illustrated FIG. 1.

FIG. 5 is an equivalent circuit diagram of a unit pixel illustrated in FIG. 1.

FIGS. 6A and 6B are examples of a timing chart of biases applied to a transfer gate and an electrode layer when the imaging device illustrated in FIG. 1 captures an image at normal times.

FIG. 7 is a schematic view of one example of a cross-sectional configuration taken along a line II-II of an imaging device according to a modification example 1 of the present disclosure.

FIG. 8 is a schematic view of one example of a cross-sectional configuration taken along a line III-III of the imaging device according to the modification example 1 of the present disclosure.

FIG. 9 is a schematic plan view of a configuration of the imaging device illustrated in FIG. 7 or the like.

FIG. 10 is a schematic view of one example of a cross-sectional configuration taken along a line IV-IV of an imaging device according to a modification example 2 of the present disclosure.

FIG. 11 is a schematic view of one example of a cross-sectional configuration taken along a line V-V of the imaging device according to the modification example 2 of the present disclosure.

FIG. 12 is a schematic plan view of a configuration of the imaging device illustrated in FIG. 10 or the like.

FIG. 13 is a schematic cross-sectional view of one example of a configuration of an imaging device according to a modification example 3 of the present disclosure.

FIG. 14 is a schematic plan view of a configuration of the imaging device illustrated in FIG. 13.

FIGS. 15A, 15B, and 15C are examples of a timing chart of biases applied to a transfer gate or two electrode layers when the imaging device illustrated in FIG. 13 captures an image at normal times.

FIG. 16 is a schematic plan view of one example of a configuration of an imaging device according to a modification example 4 of the present disclosure.

FIG. 17 is a schematic plan view of one example of a configuration of an imaging device according to a modification example 5 of the present disclosure.

FIG. 18 is a schematic cross-sectional view of one example of a configuration of an imaging device according to a modification example 6 of the present disclosure.

FIG. 19 is a schematic cross-sectional view of one example of a configuration of an imaging device according to a modification example 7 of the present disclosure.

FIG. 20 is a schematic cross-sectional view of one example of a configuration of an imaging device according to a modification example 8 of the present disclosure.

FIG. 21 is a schematic cross-sectional view of one example of a configuration of an imaging device according to a modification example 9 of the present disclosure.

FIG. 22 is a schematic cross-sectional view of a configuration on second surface side of a semiconductor substrate of the imaging device illustrated in FIG. 21.

FIGS. 23A, 23B, and 23C are examples of a timing chart of biases applied to a transfer gate or two electrode layers when the imaging device illustrated in FIG. 21 captures an image at normal times.

FIG. 24 is a schematic cross-sectional view of one example of a configuration of an imaging device according to a modification example 10 of the present disclosure.

FIG. 25 is a schematic plan view of one example of a configuration on second surface side of a semiconductor substrate of the imaging device illustrated in FIG. 24.

FIG. 26 is a schematic plan view of another example of the configuration on second surface side of the semiconductor substrate of the imaging device illustrated in FIG. 24.

FIGS. 27A, 27B, and 27C are examples of a timing chart of biases applied to a transfer gate or two electrode layers when the imaging device illustrated in FIG. 24 captures an image at normal times.

MODES FOR CARRYING OUT THE INVENTION

Some embodiments of the present disclosure are described below in detail with reference to the drawings. The following description is a specific example of the present disclosure, and the present disclosure is not limited to the following embodiments. In addition, the present disclosure is not limited to arrangements, dimensions, dimension ratios, etc. of respective components illustrated in each drawing. It is to be noted that description is given in the following order.

1. Embodiment (An example of an imaging device including an electrode layer provided over an entire surface of a pixel section on light incident side)
2. Modification Examples
  2-1. Modification Example 1 (Another example of a layout of the electrode layer)
  2-2. Modification Example 2 (Another example of the layout of the electrode layer)
  2-3. Modification Example 3 (Another example of the layout of the electrode layer)
  2-4. Modification Example 4 (Another example of the layout of the electrode layer)
  2-5. Modification Example 5 (Another example of the layout of the electrode layer)
  2-6. Modification Example 6 (Another example of a configuration of an in-pixel isolation section)

2-7. Modification Example 7 (Another example of the layout of the electrode layer)
  2-8. Modification Example 8 (Another example of the layout of the electrode layer)
  2-9. Modification Example 9 (Another example of the layout of the electrode layer)
  2-10. Modification Example 10 (Another example of the layout of the electrode layer)
  2-11. Modification Example 11 (Another example of the layout of the electrode layer)
  2-12. Modification Example 12 (Another example of the layout of the electrode layer)
3. Application Examples
4. Practical Application Examples

1. EMBODIMENT

FIG. 1 schematically illustrates one example of a cross-sectional configuration of an imaging device (imaging device 1) according to an embodiment of the present disclosure. FIG. 2 schematically illustrates a planar configuration on light incident side S1 of the imaging device 1 illustrated in FIG. 1. FIG. 3 schematically illustrates a planar configuration on side opposite to the light incident side S1 of the imaging device 1 illustrated in FIG. 1. Note that FIG. 1 illustrates a cross section taken along a line I-I illustrated in FIGS. 2 and 3. FIG. 4 illustrates one example of an entire configuration of the imaging device 1 illustrated in FIG. 1. For example, the imaging device 1 includes a CMOS (Complementary Metal Oxide Semiconductor) imaging sensor or the like used in an electronic apparatus such as a digital still camera or a video camera, and includes, as an imaging area, a pixel section (pixel section 100A) in which a plurality of pixels is two-dimensionally disposed in a matrix. For example, the imaging device 1 includes a so-called back-illuminated type imaging device in this CMOS imaging sensor or the like.

The imaging device 1 according to the present embodiment includes a pixel (unit pixel P) that makes it possible to acquire imaging information and parallax information at the same time. In the imaging device 1 according to the present embodiment, an electrode layer 22 is provided over an entire surface of the pixel section 100A in which a plurality of unit pixels P each including a plurality of photoelectric converters 12 is disposed in a matrix.

(Schematic Configuration of Imaging Device)

The imaging device 1 receives incident light (image light) from a subject through an optical lens system (not illustrated), and converts, into an electric signal, the light amount of the incident light formed as an image on an imaging plane for each pixel to output the electric signal as a pixel signal. The imaging device 1 includes the pixel section 100A serving as an imaging area on the semiconductor substrate 11, and also includes, for example, a vertical drive circuit 111, a column signal processing circuit 112, a horizontal drive circuit 113, an output circuit 114, a control circuit 115, and an input-output terminal 116 in a region (peripheral region 100B) surrounding this pixel section 100A.

For example, in the pixel section 100A, a plurality of unit pixels P is two-dimensionally disposed in a matrix. The plurality of unit pixels P serves as both imaging pixels and imaging-plane phase-difference pixels. The imaging pixels photoelectrically converts, in a photodiode PD, a subject image formed as an image by an imaging lens, to generate a signal for image generation. The imaging-plane phase-difference pixels divide a pupil region of an imaging lens, and photoelectrically converts a subject image from the divided pupil region, to generate a signal for phase-difference detection.

For example, the unit pixels P are wired to a pixel drive line Lread (specifically, a row selection line and a reset control line) for each pixel row, and are wired to a vertical signal line Lsig for each pixel column. The pixel drive line Lread is configured to transfer a drive signal used to read a signal from a pixel. The pixel drive line Lread has one end coupled to an output end corresponding to each row of the vertical drive circuit 111.

The vertical drive circuit 111 includes a shift register, an address decoder, and the like, and is a pixel drive section that drives each of the unit pixels P of the pixel section 100A, for example, on a row basis. A signal outputted from each of the unit pixels P in a pixel row selectively scanned by the vertical drive circuit 111 is supplied through each vertical signal line Lsig to the column signal processing circuit 112. The column signal processing circuit 112 includes an amplifier, a horizontal selection switch, and the like provided for each vertical signal line Lsig.

The horizontal drive circuit 113 includes a shift register, an address decoder, and the like, and sequentially drives each horizontal selection switch of the column signal processing circuit 112 while performing scanning. With the selective scanning by this horizontal drive circuit 113, a signal of each of the pixels transferred through each vertical signal line Lsig is sequentially outputted to a horizontal signal line 121, and is transferred to the outside of the semiconductor substrate 11 through this horizontal signal line 121.

The output circuit 114 performs a signal process on the signal sequentially supplied from each column signal processing circuit 112 through the horizontal signal line 121, and outputs the signal. For example, in some cases, the output circuit 114 may perform only buffering, or may perform black-level adjustment, column-variation correction, and various types of digital signal processing or the like.

The circuit portions including the vertical drive circuit 111, the column signal processing circuit 112, the horizontal drive circuit 113, the horizontal signal line 121, and the output circuit 114 may be formed directly on the semiconductor substrate 11, or may be disposed on an external control IC. Furthermore, these circuit portions may be formed on another substrate coupled through a cable or the like.

The control circuit 115 receives a clock provided from the outside of the semiconductor substrate 11 or data that gives an instruction concerning an operating mode or the like, and outputs data concerning internal information about the imaging device 1. The control circuit 115 further includes a timing generator that generates various types of timing signals, and performs drive control of peripheral circuits such as the vertical drive circuit 111, the column signal processing circuit 112, and the horizontal drive circuit 113 on the basis of various types of timing signals generated by the timing generator.

The input-output terminal 116 receives or provides signals from or to the outside.

[Circuit Configuration of Unit Pixel]

FIG. 5 illustrates one example of a readout circuit of the unit pixel P of the imaging device 1 illustrated in FIG. 4. As illustrated, for example, in FIG. 5, the unit pixel P includes two photoelectric converters 12A and 12B, transfer transistors TR1 and TR2, a floating diffusion FD, a reset transistor RST, an amplification transistor AMP, and a selection transistor SEL.

The photoelectric converters 12A and 12B each include a photodiode (PD). The photoelectric converter 12A has an anode coupled to the grounding voltage line and also has a cathode coupled to the source of the transfer transistor TR1. As with the photoelectric converter 12A, a photoelectric converter 12 has an anode coupled to the grounding voltage line and also has a cathode coupled to the source of the transfer transistor TR2.

The transfer transistor TR1 is coupled between the photoelectric converter 12A and the floating diffusion FD. The transfer transistor TR2 is coupled between the photoelectric converter 12B and the floating diffusion FD. A drive signal TRsig is applied to each of the gate electrodes of the transfer transistors TR1 and TR2. When this drive signal TRsig turns into an active state, the transfer gate of each of the transfer transistors TR1 and TR2 turns into an electrically conducting state, and signal charges accumulated in the photoelectric converters 12A and 12B are transferred to the floating diffusion FD through the transfer transistors TR1 and TR2.

The floating diffusion FD is coupled between the amplification transistor AMP and the transfer transistors TR1 and TR2. The floating diffusion FD converts the signal charge transferred through each of the transfer transistors TR1 and TR2 into a voltage signal through electric charge-voltage conversion, and outputs the voltage signal to the amplification transistor AMP.

The reset transistor RST is coupled between the floating diffusion FD and a power supply section. A drive signal RSTsig is applied to the gate electrode of the reset transistor RST. When this drive signal RSTsig turns into an active state, the reset gate of the reset transistor RST turns into an electrically conducting state, and a potential of the floating diffusion FD is reset to be a level of the power supply section.

The amplification transistor AMP has a gate electrode coupled to the floating diffusion FD and also has a drain electrode coupled to the power supply section. The amplification transistor AMP serves as an input unit for a readout circuit concerning a voltage signal held by the floating diffusion FD, that is, a so-called source follower circuit. In other words, the amplification transistor AMP has the source electrode coupled to the vertical signal line Lsig through the selection transistor SEL. This constitutes the source follower circuit with a constant-current source coupled to the one end of the vertical signal line Lsig.

The selection transistor SEL is coupled between the source electrode of the amplification transistor AMP and the vertical signal line Lsig. A drive signal SELsig is applied to the gate electrode of the selection transistor SEL. When this drive signal SELsig turns into an active state, the selection transistor SEL turns into an electrically conducting state, and the unit pixel P turns into a selected state. Thus, a readout signal (pixel signal) outputted from the amplification transistor AMP is outputted through the selection transistor SEL to the vertical signal line Lsig.

In the unit pixel P, a signal charge generated in the photoelectric converter 12A and a signal charge generated in the photoelectric converter 12B are read, for example. The signal charges read from the photoelectric converter 12A and the photoelectric converter 12B are outputted, for example, to a phase-difference computation block of an external signal processing unit. This makes it possible to acquire a signal for a phase-difference autofocus. In addition, these signal charges read from the photoelectric converter 12A and the photoelectric converter 12B are added together in the floating diffusion FD, and are outputted, for example, to an imaging block of an external signal processing unit. This makes it possible to acquire a pixel signal based on the total electric charge of the photoelectric converter 12A and the photoelectric converter 12B.

[Configuration of Unit Pixel]

As described above, the imaging device 1 is, for example, a back-illuminated type imaging device. For example, the unit pixel P has a configuration in which a light receiving unit 10, a light condenser 20, and a multi-layer wiring layer 30 are stacked. The light condenser 20 is provided on the light incident side S1 of the light receiving unit 10. The multi-layer wiring layer 30 is provided on side opposite to the light incident side S1 of the light receiving unit 10.

The light receiving unit 10 includes the semiconductor substrate 11 having a first surface 11S1 and a second surface 11S2 that are opposed to each other, and also includes a plurality of photoelectric converters 12 formed so as to be embedded in the semiconductor substrate 11. The semiconductor substrate 11 includes, for example, a silicon substrate. The photoelectric converter 12 is, for example, a PIN (Positive Intrinsic Negative) type photodiode (PD), and includes a pn junction in a predetermined region of the semiconductor substrate 11. As described above, a plurality of photoelectric converters 12 (for example, two (photoelectric converters 12A and 12B)) is formed so as to be embedded in each of the unit pixels P.

The light receiving unit 10 further includes an inter-pixel isolation section 13 and an in-pixel isolation section 14.

The inter-pixel isolation section 13 is provided between adjacent unit pixels P. In other words, the inter-pixel isolation section 13 is provided on the periphery of the unit pixel P, and in the pixel section 100A, is provided, for example, in a lattice form. The inter-pixel isolation section 13 is provided to electrically and optically isolate adjacent unit pixels P from each other. The inter-pixel isolation section 13 extends, for example, from the second surface 11S2 side of the semiconductor substrate 11 toward the first surface 11S1 side, and penetrates through, for example, between the second surface 11S2 and the first surface 11S1 of the semiconductor substrate 11.

The inter-pixel isolation section 13 includes a light shielding film 13A having, for example, electrical conductivity, and also includes an insulating film 13B provided on the periphery of the light shielding film 13A. The light shielding film 13A includes, for example, a single layer film or a stacked film including tungsten (W), silver (Ag), copper (Cu), aluminum (Al), an alloy of Al and copper (Cu), or the like. In addition, it may be possible to form the light shielding film 13A using polysilicon (Poly-Si) or amorphous silicon. The insulating film 13B includes, for example, a silicon oxide (SiO$_x$) film or the like.

The in-pixel isolation section 14 is provided between adjacent photoelectric converters 12 (for example, the photoelectric converter 12A and the photoelectric converter 12B) in the unit pixel P. The in-pixel isolation section 14 is provided to electrically isolate adjacent photoelectric converters 12 from each other. The in-pixel isolation section 14 extends, for example, from the second surface 11S2 of the semiconductor substrate 11 toward the first surface 11S1, and has, for example, an end surface 14S1 within the semiconductor substrate 11. In other words, the in-pixel isolation section 14 includes, for example, the semiconductor substrate 11 of several hundreds of nm between the end surface 14S1 and the first surface 11S1 of the semiconductor substrate 11.

As with the inter-pixel isolation section 13, the in-pixel isolation section 14 includes, for example, a light shielding film 14A having electrical conductivity, and also includes an insulating film 14B provided between the light shielding film 14A and the semiconductor substrate 11. The light shielding film 14A includes, for example, a single layer film or a stacked film including tungsten (W), silver (Ag), copper (Cu), aluminum (Al), an alloy of Al and copper (Cu), or the like. In addition, it may be possible to form the light shielding film 14A using polysilicon (Poly-Si) or amorphous silicon. The insulating film 14B includes, for example, a silicon oxide (SiO$_x$) film or the like.

A fixed electric charge layer 15 is provided on the first surface 11S1 of the semiconductor substrate 11, a side surface of the inter-pixel isolation section 13, a side surface and the end surface 14S1 of the in-pixel isolation section 14. The fixed electric charge layer 15 may be a film having a positive fixed electric charge or may be a film having a negative fixed electric charge. The constituent material of the fixed electric charge layer 15 includes a semiconductor material or an electrically conductive material having a band gap wider than the band gap of the semiconductor substrate 11. For example, specifically, examples of the material include hafnium oxide (HfO$_x$), aluminum oxide (AlO$_x$), zirconium oxide (ZrO$_x$), tantalum oxide (TaO$_x$), titanium oxide (TiO$_x$), lanthanum oxide (LaO$_x$), praseodymium oxide (PrO$_x$), cerium oxide (CeO$_x$), neodymium oxide (NdO$_x$), promethium oxide (PmO$_x$), samarium oxide (SmO$_x$), europium oxide (EuO$_x$), gadolinium oxide (GdO$_x$), terbium oxide (TbO$_x$), dysprosium oxide (DyO$_x$), holmium oxide (HoO$_x$), thulium oxide (TmO$_x$), ytterbium oxide (YbO$_x$), lutetium oxide (LuO$_x$), yttrium oxide (YO$_x$), hafnium nitride (HfN$_x$), aluminum nitride (AlN$_x$), hafnium oxynitride (HfO$_x$N$_y$), aluminum oxynitride (AlO$_x$N$_y$), and the like. The fixed electric charge layer 15 may be a single layer film, or may be a stacked film including different materials.

The transfer transistors TR1 and TR2, the floating diffusion FD, and the like that constitute the readout circuit of the unit pixel P described above are provided on the second surface 1S2 of the semiconductor substrate 11.

The light condenser 20 is provided on the light incident side S1 of the light receiving unit 10. The light condenser 20 includes, for example, a protection layer 21 that covers the first surface 11S1 of the semiconductor substrate 11, an electrode layer 22 having light transmissivity, a planarizing layer 23, and a lens layer 24. These layers are stacked in this order from the light receiving unit 10 side.

The protection layer 21 is used to protect the first surface 11S1 of the semiconductor substrate 11. The protection layer 21 is formed, for example, by using silicon oxide (SiO$_x$), silicon nitride (SiN$_x$), silicon oxynitride (SiO$_x$N$_y$), or the like.

The electrode layer 22 is provided so as to cover the entire surface of the unit pixel P, and is provided, for example, over the entire surface of the pixel section 100A in which the plurality of unit pixels P each including the plurality of photoelectric converters 12 is disposed in a matrix. In addition, the electrode layer 22 extends up to the periphery of the pixel section 100A. The electrode layer 22 is electrically coupled, for example, to the control circuit 115 in the peripheral region 100B, and it is possible to freely control the potential thereof.

The electrode layer 22 includes, for example, metallic oxide having light transmissivity. Examples of metal atoms that constitute such metallic oxide include, for example, tin (Sn), zinc (Zn), indium (In), silicon (Si), zirconium (Zr), aluminum (Al), gallium (Ga), tungsten (W), chromium (Cr), cobalt (Co), nickel (Ni), tantalum (Ta), niobium (Nb), and molybdenum (Mo). The metallic oxide containing one or more types of the metal atoms described above includes, for example, ITO (indium tin oxide). However, in addition to ITO, a tin oxide ($SnO_2$)-based material to which a dopant is added or a zinc oxide-based material obtained by adding a dopant to aluminum zinc oxide may be used as the constituent material of the electrode layer 22. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. Furthermore, CuI, $InSbO_4$, ZnMgO, $CuInO_2$, $MgIn_2O_4$, CdO, $ZnSnO_3$, or the like may be used in addition to these materials.

The planarizing layer 23 is used to planarize a front surface on the light incident side S1. The planarizing layer 23 is formed, for example, using silicon oxide ($SiO_x$), silicon nitride ($SiN_x$), silicon oxynitride ($SiO_xN_y$), or the like.

The lens layer 24 is provided so as to cover the entire surface of the pixel section 100A, and has a front surface including a plurality of on-chip lenses 24L provided, for example, in a gap-less manner. Each of the on-chip lenses 24L is used to collect, into the photoelectric converter 12, light entering from above, and for example, is provided for each unit pixels Pas illustrated in FIG. 2. In other words, each of the on-chip lenses 24L is provided so as to extend over the plurality of photoelectric converters 12 in the unit pixel P. The lens layer 24 is formed, for example, using an inorganic material such as silicon oxide ($SiO_x$) or silicon nitride ($SiN_x$). In addition, the lens layer 24 may be formed using an organic material having high index of refraction such as episulfide-based resin, a thietane compound, or resin thereof. There is no particular limitation as to the shape of the on-chip lens 24L, and it is possible to employ various types of lens shapes such as a half-sphere shape or a half-tubular shape.

The multi-layer wiring layer 30 is provided on side opposite to the light incident side S1 of the light receiving unit 10. For example, the multi-layer wiring layer 30 has a configuration in which a plurality of wiring layers 31, 32, and 33 is stacked with an interlayer insulating layer 34 interposed therebetween. In addition to the readout circuit described above, the vertical drive circuit 111, the column signal processing circuit 112, the horizontal drive circuit 113, the output circuit 114, the control circuit 115, the input-output terminal 116, and the like are formed on the multi-layer wiring layer 30, for example.

The wiring layers 31, 32, and 33 are formed by using, for example, aluminum (Al), copper (Cu), or tungsten (W). In addition, the wiring layers 31, 32, and 33 may be formed by using polysilicon.

For example, the interlayer insulating layer 34 includes a single layer film including one type from among silicon oxide ($SiO_x$), TEOS, silicon nitride ($SiN_x$), silicon oxynitride ($SiO_xN_y$), and the like, or includes a stacked film including two or more types from among these materials.

Workings and Effects

In the imaging device 1 according to the present embodiment, the plurality of unit pixels P is disposed in a matrix in the pixel section 100A of the semiconductor substrate 11. The unit pixels P each include the plurality of photoelectric converters 12 that generates, through photoelectric conversion, an electric charge corresponding to the amount of received light. The semiconductor substrate 11 further includes the inter-pixel isolation section 13 between adjacent unit pixels P and the in-pixel isolation section 14 between adjacent photoelectric converters 12 within the unit pixel P. In the present embodiment, the electrode layer 22 is provided, on the first surface 11S1 side of the semiconductor substrate 11, over the entire surface of the pixel section 100A in which the plurality of unit pixels P is disposed in a matrix. This configuration makes it possible to form an inversion region X in proximity to the first surface 11S1 as necessary. This will be described below.

In recent years, a semiconductor imaging device (imaging device) having a focus detection function using a phase-difference detection type has been widely available. In such an imaging device, each pixel includes a plurality of photodiodes (PDs), and one on-chip lens is shared with the plurality of PDs, which makes it possible to acquire imaging information and parallax information at the same time.

With such an imaging device, in a case where light is applied vertically to the on-chip lens shared with the plurality of PDs, the same amount of electric charges (for example, electrons) generated through photoelectric conversion is collected and accumulated in each of the PDs divided, for example, into left and right portions. However, in a case where light is applied obliquely to the on-chip lens, the number of electrons that have been collected and accumulated differs between the left-side PD and the right-side PD. The difference in the number of electrons depends on the angle of applied light. By using this characteristic, the phase difference in light is detected to perform autofocus in each of the unit pixels.

Meanwhile, in the imaging device, high integration of unit pixels is demanded for the purpose of improving imaging quality. As a method that responds to this demand, it is considered to make the unit pixels finer, for example. In a case where the unit pixels are made finer, with the unit pixel (phase-difference detection pixel) that detects a phase difference described above, it is difficult to include a plurality of PDs in a unit pixel and isolate the PDs from each other. For example, if the distance between adjacent PDs is reduced, electrons accumulated in each of the PDs are more easily mixed, which results in occurrence of mixture of colors and leads to a deterioration in imaging performance. In order to avoid this, development is made of a method of providing an isolation structure such as FTI (Full Trench Isolation) between adjacent PDs to electrically suppress the mixture of colors.

Since left and right PDs are isolated from each other by the FTI, the unit pixel including the FTI between adjacent PDs has excellent phase-difference detection performance. Incidentally, in a case of receiving high-illuminance oblique light at the normal imaging times, electrons accumulated in either the left PD or the right PD may exceed the full well capacity. Such a case causes an issue in that the excessive electrons are discharged to the floating diffusion (FD), and the number of electrons in a unit pixel that is the total sum of electrons accumulated in the left and right PDs is lower than the original full well capacity, which results in a reduction in the dynamic range. Here, the "original full well capacity" represents a capacity obtained by adding together the full well capacities of the left and right PDs. For example, the number of electrons accumulated in the left and right PDs for light entering vertically is the same number. Thus, in such a case, it is possible to accumulate electrons to the original full well capacity.

As a method of solving this issue, there is a method using impurity doping to isolate the left and right PDs. The electrically-conductive type of impurity used to isolate the left and right PDs is, for example, a p-type in a case where the PD is an n-type impurity. In a case where the left and right PDs are isolated by the impurity doping, the density of the impurity profile is made inconsistent. With this configuration, in a case where the number of electrons increases in either the left or right PD, it is possible to move (overflow) electrons to the other PD through a region where the density of impurity of isolation is low. This makes it possible to prevent the excessive electrons from being discharged to the FD, and accumulate electrons in the PD up to the original full well capacity of the unit pixel.

However, in a case where the density of the impurity profile is made inconsistent by implanting impurities as described above, a plurality of types is implanted. This leads to an issue in that it is difficult to adjust the implantation energy and the amount of implantation (the amount of dose). In addition, the density of isolation impurity is low in the region through which the excessive electrons move. This leads to an issue in that the potential of this region easily changes depending on the situation in the unit pixel. For example, upon detecting a phase difference, electrons accumulated in each of the left and right PDs is read. For example, in a case where the left PD is first read, the potential in the left PD increases, and the potential in the moving path also increases. Thus, some of electrons accumulated in the right-side PD move to the left-side PD, and are read, which results in a deterioration in phase-difference detection performance.

In contrast, the present embodiment is configured such that the electrode layer 22 is provided over the entire surface of the pixel section 100A in which the plurality of unit pixels P each including the plurality of photoelectric converters 12 is disposed in a matrix, and the inversion region X in proximity to the first surface 11S1 is formed as necessary.

The imaging device 1 illustrated in FIG. 1 indicates a state in which, for example, a positive bias is applied to the electrode layer 22. In the imaging device 1 according to the present embodiment, the electrode layer 22 is electrically coupled to the control circuit 115 in the peripheral region 100B as described above, and it is possible to freely control the potential thereof. The semiconductor substrate 11, the protection layer 21 including, for example, an oxide film, and the electrode layer 22 are stacked above the in-pixel isolation section 14 to form a so-called MOS (Metal-Oxide-Semiconductor) capacitor (MOSCAP). For example, with this configuration, as a positive bias is applied to the electrode layer 22, the (weak) inversion region X is formed in the semiconductor substrate 11. This inversion region X serves as an overflow section for an electric charge (for example, an electron) between adjacent photoelectric converters 12 in the unit pixel P. In addition, as a negative bias is applied to the electrode layer 22, the inversion region X vanishes, and electrons accumulated in the inversion region X and in proximity to the inversion region X are moved or pushed to the photoelectric converter 12.

FIGS. 6A and 6B illustrate one example of a timing chart of biases applied to the gate (transfer gate) TG FIG. 6A of each of the transfer transistors TR1 and TR2, and the electrode layer 22 FIG. 6B. V_high1 is a positive bias applied to the transfer gate TG, and V_high2 is a positive bias applied to the electrode layer 22. V_low1 is a negative bias applied to the transfer gate TG, and V_low2 is a negative bias applied to the electrode layer 22. When the time (t) corresponding to a readout operation falls in a period from ti1 to tf1, the positive bias V_high1 is applied to the transfer gate TG. In association with the readout operation of the transfer gate TG, the negative bias V_low2 is applied to the electrode layer 22 while the time (t) falls in a period from ti2 to tf2. As ti2 is set to be later than ti1 (ti1<ti2), it is desirable that the delay time thereof range from several nsec seconds to several tens of nsec seconds. While tf2 may be the same time as tf1, tf2 may be earlier than tf1, or tf2 may be later than tf1, it is desirable that the difference time between tf1 and tf2 range from 0 to several tens of nsec seconds. Note that, although illustration is not given, the negative bias V_low2 as the bias applied to the electrode layer 22 is always applied to the electrode layer 22 upon detecting a phase difference, regardless of the operation of the transfer gate TG.

In the imaging device 1, the transfer gate TG and the floating diffusion FD are formed on the second surface 11S2 side of the semiconductor substrate 11. Thus, it is possible to freely control the potential of the overflow section only with the bias condition of the electrode layer 22, regardless of the bias conditions of the transfer gate TG and the floating diffusion FD. Even if the distance between the first surface 11S1 of the semiconductor substrate 11 and the in-pixel isolation section 14 and the thickness of the oxide film of the MOSCAP including the electrode layer 22 in manufacturing differ from designed ones due to variation or the like, this configuration enables the pixel characteristic after manufacturing to be the same as that in design by adjusting V_high2 and V_low2. Thus, it is possible to improve imaging performance.

In addition, in the imaging device 1 according to the present embodiment, since the electrode layer 22 is provided over the entire surface of the pixel section 100A, the inversion region X is formed over the entire surface of the first surface 11S1 of the semiconductor substrate 11. Thus, it is possible to increase the full well capacity of the unit pixel P without increasing the area of the unit pixel P.

Furthermore, with the imaging device 1 according to the present embodiment, for example, in a case where the fixed electric charge of the fixed electric charge layer 15 decreases due to a deterioration over time, a positive bias that falls in a range of several V to about 10 V is applied to the electrode layer 22, which makes it possible to cause the fixed electric charge to recover using a tunnel electrode through the protection layer 21 with the fixed electric charge layer 15.

Below, description will be made of modification examples 1 to 8 of the present disclosure, application examples, and practical application examples. Below, components similar to those in the embodiment described above are denoted by the same reference numerals, and description thereof is omitted as appropriate.

2. MODIFICATION EXAMPLES

2-1. Modification Example 1

FIGS. 7 and 8 each schematically illustrate one example of a cross-sectional configuration of an imaging device (imaging device 1A) according to the modification example 1 of the present disclosure. FIG. 9 schematically illustrates a planar configuration of the imaging device 1A according to the modification example 1 of the present disclosure. Note that FIG. 7 illustrates a cross section taken along a line II-II illustrated in FIG. 9, and FIG. 8 illustrates a cross section taken along a line III-III illustrated in FIG. 9. The imaging device 1A is, for example, a CMOS imaging sensor or the like used in an electronic apparatus such as a digital still camera or a video camera, and is, for example, a so-called back-illuminated type imaging device, as with the imaging device 1 according to the embodiment described above.

The embodiment described above gives an example in which the electrode layer 22 is provided over the entire surface of the pixel section 100A. However, the electrode layer 22 may be provided, for example, for each of the unit pixels P. At this time, as illustrated, for example, in FIG. 8, a portion of the light shielding film 13A that constitutes the inter-pixel isolation section 13 is caused to protrude from the first surface 11S1 of the semiconductor substrate 11 up to the electrode layer 22 to electrically couple the electrode layer 22 and the light shielding film 13A. This configuration enables the potential of the electrode layer 22 provided for each of the unit pixels P to be controlled independently for each of the unit pixels P from the second surface 11S2 of the semiconductor substrate 11, for example, through the contact electrode 35 and the light shielding film 13A. This makes it possible to obtain an effect similar to that of the embodiment described above.

2-2. Modification Example 2

FIGS. 10 and 11 each schematically illustrate one example of a cross-sectional configuration of an imaging device (imaging device 1B) according to the modification example 2 of the present disclosure. FIG. 12 schematically illustrates a planar configuration of the imaging device 1B according to the modification example 2 of the present disclosure. Note that FIG. 10 illustrates a cross section taken along a line IV-IV illustrated in FIG. 12, and FIG. 11 illustrates a cross section taken along a line V-V illustrated in FIG. 12. The imaging device 1B is, for example, a CMOS imaging sensor or the like used in an electronic apparatus such as a digital still camera or a video camera, and is, for example, a so-called back-illuminated type imaging device, as with the imaging device 1 according to the embodiment described above.

The embodiment described above and the modification example 1 each give an example in which the electrode layer 22 is provided over the entire surface of the pixel section 100A or provided for each of the unit pixels P. However, the configuration is not limited thereto. For example, the electrode layer 22 is provided for every four unit pixels P arrayed in two rows and two columns as illustrated in FIG. 12. At this time, as with the modification example 1, a portion of the light shielding film 13A that constitutes the inter-pixel isolation section 13 is caused to protrude from the first surface 11S1 of the semiconductor substrate 11 up to the electrode layer 22 to electrically couple the electrode layer 22 and the light shielding film 13A. This configuration enables the potential of the electrode layer 22 provided for each of the unit pixels P to be controlled independently for each of the unit pixels P from the second surface 11S2 of the semiconductor substrate 11, for example, through the contact electrode 35 and the light shielding film 13A. This makes it possible to obtain an effect similar to that of the embodiment described above.

In addition, this provides an effect in which it is possible to achieve stable manufacturing in terms of misalignment upon patterning the electrode layer 22, as compared with a case where the electrode layer 22 is formed for each of the unit pixels P as in the modification example 1 described above.

Note that, in a case where the electrode layer 22 is provided for every four unit pixels P arrayed in two rows and two columns as in the present modification example, four unit pixels P disposed in a so-called Bayer arrangement may be used as a unit of arrangement of each electrode layer 22. These four unit pixels P in the Bayer arrangement are disposed such that two green pixels (Pg) each configured to selectively detect green light (G) are disposed on a diagonal line, and on a diagonal line orthogonal to the diagonal line, one green pixel (Pr) configured to selectively detect red light (R) and one green pixel (Pb) configured to selectively detect blue light FIG. 6B are disposed.

2-3. Modification Example 3

FIG. 13 schematically illustrates one example of a cross-sectional configuration of an imaging device (imaging device 1C) according to the modification example 3 of the present disclosure. FIG. 14 schematically illustrates a planar configuration of the imaging device 1C illustrated in FIG. 13. Note that FIG. 13 illustrates a cross section taken along a line VI-VI illustrated in FIG. 14. The imaging device 1C is, for example, a CMOS imaging sensor or the like used in an electronic apparatus such as a digital still camera or a video camera, and is, for example, a so-called back-illuminated type imaging device, as with the imaging device 1 according to the embodiment described above.

The electrode layer 22 may include electrode layers 22A and 22B provided above a portion between adjacent photoelectric converters 12 in a unit pixel P and above a portion between adjacent unit pixels P, respectively, as illustrated, for example, in FIGS. 13 and 14. The electrode layer 22A is provided to extend over adjacent photoelectric converters 12 in a unit pixel P, and is used to control a potential of the overflow section between the adjacent photoelectric converters 12 in the unit pixel P. The electrode layer 22B is provided to extend over adjacent unit pixels P, and is used to control a potential of the MOSCAP to vary the full well capacity of each of the unit pixels P. The electrode layers 22A and 22B each extend, for example, in a Y axis direction. In addition, although illustration is not given, the electrode layers 22A and 22B are electrically coupled to the control circuit 115 in the peripheral region 100B, and it is possible to independently freely control the potential thereof.

FIGS. 15A, 15B, and 15C illustrate one example of a timing chart of biases applied to the transfer gate TG FIG. 15A of each of the transfer transistors TR1 and TR2, the electrode layer 22A FIG. 15B, and the electrode layer 22B FIG. 15C at the normal imaging time. V_high1 is a positive bias applied to the transfer gate TG. V_high2 is a positive bias applied to the electrode layer 22A, and V_high3 is a positive bias applied to the electrode layer 22B. V_low1 is a negative bias applied to the transfer gate TG. V_low2 is a negative bias applied to the electrode layer 22A, and V_low3 is a negative bias applied to the electrode layer 22B. When the time (t) corresponding to a readout operation falls in a period from ti1 to tf1, the positive bias V_high1 is applied to the transfer gate TG. In association with the readout operation of the transfer gate TG, the negative bias V_low2 is applied to the electrode layer 22A while the time (t) falls in a period from ti2 to tf2. Similarly, in association with the readout operation of the transfer gate TG, the negative bias V_low3 is applied to the electrode layer 22B while the time (t) falls in a period from ti3 to tf3.

As ti2 and ti3 are set to be later than ti1 (ti1<ti2=ti3), it is desirable that the delay time thereof range from several nsec seconds to several tens of nsec seconds. While tf2 and tf3 may be the same time as tf1, tf2 and tf3 may be earlier than tf1, tf2 and tf3 may be later than tf1, it is desirable that the difference time between tf1 and tf2 or tf3 range from 0 to several tens of nsec seconds. Note that, although illustration is not given, the negative bias V_low2 as the bias applied to the electrode layers 22A and 22B is always applied to the electrode layers 22A and 22B upon detecting a phase difference, regardless of the operation of the transfer gate TG.

In this manner, the imaging device 1C according to the present modification example is configured such that the electrode layers 22A and 22B that are able to independently control a potential are provided above a portion between adjacent photoelectric converters 12 in a unit pixel P and above a portion between adjacent unit pixels P, respectively. This makes it possible to independently form inversion regions XA and XB between adjacent photoelectric converters 12 in a unit pixel P and between adjacent unit pixels P, respectively. In other words, this makes it possible to independently freely control a potential of an overflow section between adjacent photoelectric converters 12 in a unit pixel P and a potential of an MOSCAP between adjacent unit pixels P.

With this configuration, it is possible to obtain the following effect, in addition to the effect of the embodiment described above. For example, upon detecting a phase difference, by applying a negative bias to the electrode layer 22A and applying a positive bias to the electrode layer 22B, the full well capacity increases in each of adjacent photoelectric converters. This makes it possible to correctly detect a phase difference even if high illuminance light is received, which makes it possible to improve autofocus performance, as compared with a typical imaging device.

2-4. Modification Example 4

FIG. 16 schematically illustrates one example of a planar configuration of an imaging device (imaging device 1D) according to the modification example 4 of the present disclosure. The imaging device 1D is, for example, a CMOS imaging sensor or the like used in an electronic apparatus such as a digital still camera or a video camera, and is, for example, a so-called back-illuminated type imaging device, as with the imaging device 1 according to the embodiment described above.

The modification example 3 described above gives an example in which the electrode layers 22A and 22B are each formed so as to extend, for example, in the Y axis direction. However, the layout of the electrode layers 22A and 22B is not limited thereto. For example, as illustrated, for example, in FIG. 16, the electrode layers 22A and 22B may be shifted in the Y axis direction by one unit pixel and be provided for every two unit pixels P adjacent in the Y axis direction, and the electrode layers 22A adjacent in the X axis direction or electrode layers 22B adjacent in the X axis direction may be coupled to each other above the inter-pixel isolation section 13. Note that, although illustration is not given, the electrode layers 22A and 22B according to the present modification example are electrically coupled to the control circuit 115 in the peripheral region 100B, and it is possible to independently freely control each potential thereof, as with the modification example 3.

With such a configuration, it is also possible to independently form inversion regions XA and XB between adjacent photoelectric converters 12 in a unit pixel P and between adjacent unit pixels P, respectively, and it is possible to obtain an effect similar to that of the modification example 3 described above.

2-5. Modification Example 5

FIG. 17 schematically illustrates one example of a planar configuration of an imaging device (imaging device 1E)

according to the modification example 5 of the present disclosure. The imaging device 1E is, for example, a CMOS imaging sensor or the like used in an electronic apparatus such as a digital still camera or a video camera, and is, for example, a so-called back-illuminated type imaging device, as with the imaging device 1 according to the embodiment described above.

The modification examples 3 and 4 described above give an example in which a potential is applied to each of the electrode layers 22A and 22B in the peripheral region 100B. However, the configuration is not limited thereto. For example, as with the modification example 1, the electrode layer 22A may be electrically coupled to the light shielding film 13A protruding from the first surface 11S1 of the semiconductor substrate 11 to apply a potential, for example, through the contact electrode 35 and the light shielding film 13A from the second surface 11S2 side of the semiconductor substrate 11. This makes it possible to independently control a potential A of the electrode layer 22 for every two unit pixels P adjacent, for example, in the Y axis direction to each other.

2-6. Modification Example 6

FIG. 18 schematically illustrates one example of a cross-sectional configuration of an imaging device (imaging device 1F) according to the modification example 6 of the present disclosure. The imaging device 1F is, for example, a CMOS imaging sensor or the like used in an electronic apparatus such as a digital still camera or a video camera, and is, for example, a so-called back-illuminated type imaging device, as with the imaging device 1 according to the embodiment described above.

The embodiment described above gives an example in which the in-pixel isolation section 14 includes, for example, the light shielding film 14A having electrical conductivity and the insulating film 14B. However, the configuration is not limited thereto. An in-pixel isolation section 44 may be formed partially or entirely using an impurity diffusion layer containing an impurity having an electrically-conductive type opposite to that of the photoelectric converter 12.

With such a configuration, it is also possible to obtain an effect similar to that of the embodiment described above.

2-7. Modification Example 7

FIG. 19 schematically illustrates one example of a cross-sectional configuration of an imaging device (imaging device 1G) according to the modification example 7 of the present disclosure. The imaging device 1G is, for example, a CMOS imaging sensor or the like used in an electronic apparatus such as a digital still camera or a video camera, and is, for example, a so-called back-illuminated type imaging device, as with the imaging device 1 according to the embodiment described above.

The embodiment described above and the like give an example in which the electrode layer 22 that covers almost entirety (for example, 80 percent or higher of the area of the unit pixel P) of the unit pixel P is provided. However, the electrode layer 22 may be selectively provided above the photoelectric converters 12 adjacent to each other in the unit pixel P.

By selectively providing the electrode layer 22 above the in-pixel isolation section 14 in this manner, in other words, at a position that extends over the photoelectric converters 12 adjacent to each other in a unit pixel P, it is possible to reduce an area where the inversion region X serving as an overflow section at the normal imaging time is formed. This makes it possible to reduce occurrence of a dark current that may be generated in the inversion region X.

2-8. Modification Example 8

FIG. 20 schematically illustrates one example of a cross-sectional configuration of an imaging device (imaging device 1H) according to the modification example 8 of the present disclosure. The imaging device 1H is, for example, a CMOS imaging sensor or the like used in an electronic apparatus such as a digital still camera or a video camera, and is, for example, a so-called back-illuminated type imaging device, as with the imaging device 1 according to the embodiment described above.

In the present modification example, the electrode layer 22 is provided, for example, over the entire surface of the pixel section 100A. In addition, a recessed portion 21X is also provided, for example, at a position of the protection layer 21 that extends over photoelectric converters 12 adjacent to each other in a unit pixel P, and the electrode layer 22 is provided so as to be embedded in this recessed portion 21X. With this configuration, the electrode layer 22 protruding toward the first surface 11S1 of the semiconductor substrate 11 above the in-pixel isolation section 14 is formed on the protection layer 21.

This makes it possible to reduce the area where the inversion region X is formed, without patterning the electrode layer 22 as in the embodiment 7 described above, and makes it possible to reduce occurrence of a dark current that may be generated in the inversion region X.

2-9. Modification Example 9

FIG. 21 schematically illustrates one example of a cross-sectional configuration of an imaging device (imaging device 1I) according to a modification example 9 of the present disclosure. FIG. 22 schematically illustrates a planar configuration of the imaging device 1I according to the modification example 9 of the present disclosure. Note that FIG. 21 illustrates a cross section taken along a line VII-VII illustrated in FIG. 22. The imaging device 1I is, for example, a CMOS imaging sensor or the like used in an electronic apparatus such as a digital still camera or a video camera, and is, for example, a so-called back-illuminated type imaging device, as with the imaging device 1 according to the embodiment described above.

In a case where the light shielding film 14A is formed using a material having electrical conductivity such as tungsten (W) as in the embodiment described above, a contact electrode 36 configured to electrically couple the light shielding film 14A and a wiring line may be provided on the second surface 11S2 side of the semiconductor substrate 11.

Note that FIG. 21 illustrates a state in which a positive bias is applied to the electrode layer 22, and the inversion region X vanishes in a case where a negative bias is applied to the electrode layer 22.

FIGS. 23A, 23B, and 23C illustrate one example of a timing chart of biases applied to the transfer gates TG FIG. 23A of each of the transfer transistors TR1 and TR2, the electrode layer 22, and the light shielding film 14A at the normal imaging times. V_high1 is a positive bias applied to the transfer gate TG. V_high2 is a positive bias applied to the electrode layer 22, and V_high3 is a positive bias applied to the electrode layer 22B. V_low1 is a negative bias applied to the transfer gate TG. V_low2 is a negative bias applied to the electrode layer 22. When the time (t) corresponding to a readout operation falls in a period from ti1 to tf1, the positive bias V_high1 is applied to the transfer gate TG. In association with the readout operation of the transfer gate TG, the negative bias V_low2 is applied to the electrode layer 22 while the time (t) falls in a period from ti2 to tf2. As ti2 is set to be later than ti1 (ti1<ti2), it is desirable that the delay time thereof range from several nsec seconds to several tens of nsec seconds. While tf2 may be the same time as tf1, tf2 may be earlier than tf1, or tf2 may be later than tf1, it is desirable that the difference time between tf1 and tf2 range from 0 to several tens of nsec seconds. Note that, although illustration is not given, the negative bias V_low2 as the bias applied to the electrode layer 22 is always applied to the electrode layer 22 upon detecting a phase difference, regardless of the operation of the transfer gate TG.

V_low3 and V_low4 are biases applied to the light shielding film 14A having electrical conductivity. V_low3 has a value lower than the substrate potential. In association with the readout operation of the transfer gate TG, the bias V_low4 that is lower than V_low3 is applied to the light shielding film 14A while the time falls in a period from ti3 to tf3. As ti3 is set to be later than ti1 (ti1<ti3), it is desirable that the delay time thereof range from several nsec seconds to several tens of nsec seconds. While tf3 may be the same time as tf1, tf3 may be earlier than tf1, or tf3 may be later than tf1, it is desirable that the difference time between tf1 and tf3 range from 0 to several tens of nsec seconds.

By applying a negative bias lower than the substrate potential to the light shielding film 14A in this manner, holes are induced on the side surface of the inter-pixel isolation section 13 in addition to the effect of the embodiment described above. This leads to a reduction in occurrence of a noise such as a white spot upon imaging. In addition, by applying a more negative bias than the substrate potential to the light shielding film 14A upon imaging, it is possible to improve a property of transferring electrons accumulated in the photoelectric converter 12.

2-10. Modification Example 10

FIG. 24 schematically illustrates one example of a cross-sectional configuration of an imaging device (imaging device 1J) according to a modification example 10 of the present disclosure. FIG. 25 schematically illustrates one example of a planar configuration of the imaging device 1J according to the modification example 10 of the present disclosure. Note that FIG. 24 illustrates a cross section taken along a line VIII-VIII illustrated in FIG. 25. The imaging device 1J is, for example, a CMOS imaging sensor or the like used in an electronic apparatus such as a digital still camera or a video camera, and is, for example, a so-called back-illuminated type imaging device, as with the imaging device 1 according to the embodiment described above.

The imaging device 1J according to the present modification example is configured such that the electrode layer 22 is provided above a portion between photoelectric converters 12 adjacent to each other in a unit pixel P, and an electrode layer 25 is provided on the inter-pixel isolation section 13 penetrating through the semiconductor substrate 11 between the first surface 11S1 and the second surface 11S2. In addition, in the imaging device 1J, on the side surface of the inter-pixel isolation section 13, a p-type impurity layer (P+) 16 is formed on the first surface 11S1 side of the semiconductor substrate 11, and a p-type impurity layer (P) 17 from the second surface 11S2 of the semiconductor substrate 11 up to the p-type impurity layer (P+) 16.

Note that FIG. 24 illustrates a state in which a positive bias is applied to the electrode layer 22, and the inversion region X vanishes in a case where a negative bias is applied to the electrode layer 22.

A P-type impurity layer coupled to the p-type impurity layer (P) 17 includes, for example, the floating diffusion FD, and a P well formed in a lower portion of the transfer gate TG. In this case, the p-type impurity layer (P+) 16 and the electrode layer 25 form a so-called P-well tap. It is desirable that the impurity concentration in the p-type impurity layer (P+) 16 be, for example, to be 1e18 cm$^{-3}$ or higher. Alternatively, in a case where the p-type impurity layer (P+) 16 is formed through ion implantation, it is desirable that the amount of dose be 1e13 cm$^{-2}$ or higher. It is desirable that the impurity concentration in the p-type impurity layer (P) 17 be, for example, 1e18 cm$^{-3}$ or less.

It is possible to form the p-type impurity layer (P+) 16 and the p-type impurity layer (P) 17, for example, by forming a trench from the second surface 11S2 side of the semiconductor substrate 11 through Si etching in an FEOL process, then applying a resist or the like to the second surface 11S2 of the semiconductor substrate 11, patterning the resist, and then implanting ions.

As with the electrode layer 22, the electrode layer 25 includes, for example, metallic oxide having light transmissivity. Examples of metal atoms that constitute such metallic oxide include, for example, tin (Sn), zinc (Zn), indium (In), silicon (Si), zirconium (Zr), aluminum (Al), gallium (Ga), tungsten (W), chromium (Cr), cobalt (Co), nickel (Ni), tantalum (Ta), niobium (Nb), and molybdenum (Mo). The metallic oxide containing one or more types from among the metal atoms described above includes, for example, ITO (indium tin oxide). However, in addition to ITO, a tin oxide ($SnO_2$)-based material to which a dopant is added or a zinc oxide-based material obtained by adding a dopant to aluminum zinc oxide may be used as the constituent material of the electrode layer 25. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. Furthermore, CuI, $InSbO_4$, ZnMgO, $CuInO_2$, $MgIn_2O_4$, CdO, $ZnSnO_3$, or the like may be used in addition to these materials.

As illustrated in FIG. 25, the electrode layer 25 is provided so as to extend over adjacent unit pixels P. The electrode layer 22 and the electrode layer 25 are each electrically coupled to the control circuit 115, for example, in the peripheral region 100B, and are able to freely control a potential thereof. The p-type impurity layer (P+) 16, the p-type impurity layer (P) 17, and a p-type impurity layer (not illustrated) coupled to the p-type impurity layer (P) 17 are configured such that a potential thereof is controlled through the electrode layer 25.

Note that FIG. 25 illustrates an example in which the electrode layer 22 and the electrode layer 25 are each formed, for example, so as to extend in the Y axis direction. However, the layout of the electrode layer 22 and the electrode layer 25 is not limited thereto. For example, as illustrated, for example, in FIG. 26, the electrode layer 22 and the electrode layer 25 may be shifted in the Y axis direction by one unit pixel and be provided for every two unit pixels P adjacent in the Y axis direction, and the electrode layers 22 adjacent in the X axis direction or the electrode layers 25 adjacent in the X axis direction are coupled to each other above the inter-pixel isolation section 13.

FIGS. 27A, 27B, and 27C illustrate one example of a timing chart of biases applied to the transfer gates TG FIG. 27A of each of the transfer transistors TR1 and TR2, the electrode layer 22, and the electrode layer 25 at the normal imaging times. V_high1 is a positive bias applied to the transfer gate TG. V_high2 is a positive bias applied to the electrode layer 22, and V_high3 is a positive bias applied to the electrode layer 22B. V_low1 is a negative bias applied to the transfer gate TG. V_low2 is a negative bias applied to the electrode layer 22. V_low3 and the V_low4 are a positive bias and a negative bias applied to the electrode layer 25, respectively. V_low3 may be the same GND as the substrate potential.

When the time (t) corresponding to a readout operation falls in a period from ti1 to tf1, the positive bias V_high1 is applied to the transfer gate TG. In association with the readout operation of the transfer gate TG, the negative bias V_low2 is applied to the electrode layer 22 while the time (t) falls in a period from ti2 to tf2. As ti2 is set to be later than ti1 (ti1<ti2), it is desirable that the delay time thereof range from several nsec seconds to several tens of nsec seconds. While tf2 may be the same time as tf1, tf2 may be earlier than tf1, or tf2 may be later than tf1, it is desirable that the difference time between tf1 and tf2 range from 0 to several tens of nsec seconds. It is desirable that ti3 be the same time as ti2, and tf3 be earlier than tf1 and tf2. Note that, although illustration is not given, the negative bias V_low2 as the bias applied to the electrode layer 22 is always applied to the electrode layer 22 upon detecting a phase difference, regardless of the operation of the transfer gate TG and the electrode layer 25.

In this manner, with the imaging device 1J according to the present modification example, by the timing chart of the biases as illustrated in FIGS. 27A, 27B, and 27C, it is possible to rapidly transfer electrons accumulated in the photoelectric converter 12 upon readout, to the floating diffusion FD from the time tf3 to the time tf1. That is, in addition to the effect of the embodiment described above, it is possible to improve the property of transferring electrons accumulated in the photoelectric converter 12.

In addition, with the imaging device 1J, by forming the P-well tap on the first surface 11S1 side, it is possible to increase the distance from the floating diffusion FD or the transfer gate TG formed on the second surface 11S2 side. This reduces an electric field generated between the p-type impurity layer (P+) 16 and an N+-type impurity layer, which reduces occurrence of a leak current.

Furthermore, by forming the P-well tap on the first surface 11S1, holes induced on the first surface 11S1 increases. This leads to a reduction in occurrence of a noise such as a white spot upon imaging. In addition, even if pixels are made finer in association with higher integration of imaging elements, the distance between the P-well tap and the floating diffusion FD or the transfer gate TG formed on the second surface 11S2 side is almost the same, and hence, the effects described above are maintained regardless of pixels being made finer. Furthermore, by forming the P-well tap on the first surface 11S1 side, it is possible to improve the degree of freedom in disposing the floating diffusion FD and the transfer gate TG formed on the second surface 11S2 side.

2-11. Modification Example 11

FIG. 28 schematically illustrates one example of a cross-sectional configuration of an imaging device (imaging device 1K) according to a modification example 11 of the present disclosure. FIG. 29 schematically illustrates one example of a planar configuration of the imaging device 1K according to the modification example 11 of the present disclosure. Note that FIG. 28 illustrates a cross section taken along a line IX-IX illustrated in FIG. 29. The imaging device 1K is, for example, a CMOS imaging sensor or the like used in an electronic apparatus such as a digital still camera or a video camera, and is, for example, a so-called back-illuminated type imaging device, as with the imaging device 1 according to the embodiment described above.

The modification example 10 gives an example in which, on the first surface 11S1 of the semiconductor substrate 11, the p-type impurity layer (P+) 16 is provided on the side surface of the inter-pixel isolation section 13 penetrating through the semiconductor substrate 11 between the first surface 11S1 and the second surface 11S2. However, the configuration is not limited thereto. The imaging device 1K is configured such that the inter-pixel isolation section 13 has a DTI (Deep Trench Isolation) structure that extends from the second surface 11S2 toward the first surface 11S1 of the semiconductor substrate 11 and has a bottom surface within the semiconductor substrate 11, and the p-type impurity layer (P+) 16 is provided between the bottom surface of the inter-pixel isolation section 13 and the first surface 11S1 of the semiconductor substrate 11 so as to extend over adjacent unit pixels P.

In this manner, with the imaging device 1K according to the present modification example, the inter-pixel isolation section 13 has the DTI structure, and the p-type impurity layer (P+) 16 is provided between the bottom surface of the inter-pixel isolation section 13 and the first surface 11S1 of the semiconductor substrate 11 so as to extend over adjacent unit pixels P. The p-type impurity layer (P+) 16 provided so as to extend over adjacent unit pixels P makes it possible to optically isolate the adjacent unit pixels P, as with the inter-pixel isolation section 13. Thus, even with the imaging device 1K according to the present modification example, it is possible to obtain an effect similar to that of the modification example 10 described above.

2-12. Modification Example 12

FIG. 30 schematically illustrates one example of a cross-sectional configuration of an imaging device (imaging device 1L) according to a twelfth modification example of the present disclosure. The imaging device 1L is, for example, a CMOS imaging sensor or the like used in an electronic apparatus such as a digital still camera or a video camera, and is, for example, a so-called back-illuminated type imaging device, as with the imaging device 1 according to the embodiment described above.

The imaging device 1L according to the present modification example is configured such that the inter-pixel isolation section 13 has a DTI structure, and the p-type impurity layer (P+) 16 is provided between the bottom surface of the inter-pixel isolation section 13 and the first surface 11S1 of the semiconductor substrate 11 so as to extend over adjacent unit pixels P, as with the modification example 11. In addition, the present modification example is configured such that, instead of omitting the electrode layer 25, the light shielding film 14A embedded in the inter-pixel isolation section 13 is caused to extend toward the first surface 11S1 to be coupled to the p-type impurity layer (P+) 16, and the light shielding film 14A is used as a through electrode to enable control, from the second surface 11S2 side, of potentials of the p-type impurity layer (P+) 16, the p-type impurity layer (P) 17, and the P-type impurity layer (not illustrated) coupled to the p-type impurity layer (P) 17. Even with such a configuration, it is possible to obtain an effect similar to that of the modification example 10 described above.

3. APPLICATION EXAMPLES

It is possible to apply the imaging device 1 or the like described above, for example, to a camera system such as a digital still camera or a video camera, a mobile phone or the like having an imaging function, and various types of electronic apparatuses having an imaging function. FIG. 31 illustrates a schematic configuration of an electronic apparatus 1000.

The electronic apparatus 1000 includes, for example, a lens group 1001, the imaging device 1, a digital signal processor (DSP) circuit 1002, a frame memory 1003, a displaying unit 1004, a storage unit 1005, an operation unit 1006, and a power supply unit 1007, which are coupled to each other through a bus line 1008.

The lens group 1001 receives incident light (image light) from a subject to form an image on an imaging plane of the imaging device 1. The imaging device 1 converts the amount of incident light of which the image is formed on the imaging plane through the lens group 1001 into an electric signal for each pixel, and supplies the electrical signal to the DSP circuit 1002 as a pixel signal.

The DSP circuit 1002 is a signal processing circuit that processes a signal supplied from the imaging device 1. The DSP circuit 1002 outputs image data obtained by processing the signal from the imaging device 1. The frame memory 1003 temporality holds, on a frame basis, the image data processed by the DSP circuit 1002.

The displaying unit 1004 includes, for example, a panel-type display device such as a liquid crystal panel or an organic EL (Electro Luminescence), and records image data on a moving image or a still image captured by the imaging device 1, in a recording medium such as a semiconductor memory or a hard disk.

In accordance with the operation by a user, the operation unit 1006 outputs an operation signal concerning various functions that the electronic apparatus 1000 has. The power supply unit 1007 supplies, on an as-necessary basis, various types of power supply serving as operation power supply of the DSP circuit 1002, the frame memory 1003, the displaying unit 1004, the storage unit 1005, and the operation unit 1006, to these targets of supply.

4. PRACTICAL APPLICATION EXAMPLES

Practical Application Example to Mobile Body

The technology according to the present disclosure (the present technology) is applicable to various products. For example, the technology according to the present disclosure may be implemented as a device to be mounted on any type of mobile body such as an automobile, an electric vehicle, a hybrid electric vehicle, a motorcycle, a bicycle, a personal mobility, an airplane, a drone, a vessel, or a robot.

FIG. 32 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 32, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 57, an audio speaker 12061, a display section 12062, and an instrument panel 12063 are illustrated as the output device. The display section 12062 may, for example, include at least one of an on-board display and a head-up display.

FIG. 33 is a diagram depicting an example of the installation position of the imaging section 12031.

In FIG. 33, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 33 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to, for example, the imaging section 12031 among the configurations described above. Specifically, an imaging device 100 is applicable to the imaging section 12031. Applying the technology according to the present disclosure to the imaging section 12031 makes it possible to obtain a high-definition captured image with less noise, which makes it possible to perform highly accurate control using the captured image in a mobile body control system.

Practical Application Example to Endoscopic Surgery System

The technology according to the present disclosure (present technology) is applicable to various products. For example, the technology according to the present disclosure may be applied to an endoscopic surgery system.

FIG. 34 is a view depicting an example of a schematic configuration of an endoscopic surgery system to which the technology according to an embodiment of the present disclosure (present technology) can be applied.

In FIG. 34, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 35 is a block diagram depicting an example of a functional configuration of the camera head 11102 and the CCU 11201 depicted in FIG. 34.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure may be applied to, for example, the image pickup unit 11402 provided on the camera head 11102 of the endoscope 11100 among the configurations described above. Applying the technology according to the present disclosure to the image pickup unit 11402 makes it possible to reduce the size of the imaging section 11402 or make the imaging section 11402 have high definition. This makes it possible to provide the endoscope 11100 having a small size or high definition.

Although the present disclosure has been described above with reference to the embodiment, the modification examples 1 to 8, the application examples, and the practical application examples, the present technology is not limited to the embodiment and the like described above, and may be modified in a variety of ways. For example, the embodiment and the like described above give an example in which a unit pixel P includes two photoelectric converters 12 (12A and 12B). However, the number of photoelectric converters 12 in a unit pixel P is not limited thereto. Three photoelectric converters 12 or four or more photoelectric converters 12 may be provided in a unit pixel P.

In addition, the embodiment and the like described above give an example in which adjacent in-pixel isolation sections 14 extend between a pair of sides, opposed to each other, of the inter-pixel isolation section 13 surrounding the unit pixel P. However, the configuration is not limited thereto. For example, the in-pixel isolation section 14 may include a space between the in-pixel isolation section 14 and the inter-pixel isolation section 13 surrounding the unit pixel P. Furthermore, the in-pixel isolation section 14 may include two in-pixel isolation sections having a so-called plug-in structure. In the plug-in structure, the two in-pixel isolation sections extend toward the middle of the unit pixel P from a corresponding one of a pair of opposed sides of the inter-pixel isolation section 13 surrounding the unit pixel P, and have a space therebetween.

Furthermore, as an example, the embodiment and the like described above give a case where an electron is read as a signal charge. However, the configuration is not limited thereto, and it is possible to use a hole as a signal charge. In this case, the opposite electrically-conductive type of the impurity is used for the photoelectric converter 12, the in-pixel isolation section 44, or the like, and the opposite bias is applied to the electrode layer 22 at the normal imaging time, the time of detecting a phase difference, or the like.

It is to be noted that the effects described herein are merely illustrative and non-limiting, and other effects may be included.

Note that the present disclosure may have the following configurations. According to the present technology having the following configurations, an electrode layer that extends over adjacent photoelectric converters is provided on light incident surface (first surface) side of a semiconductor substrate. On the semiconductor substrate, a plurality of pixels is disposed in a matrix. The semiconductor substrate includes a plurality of photoelectric converters that generate, through photoelectric conversion, an electric charge corresponding to the amount of received light for each pixel. The semiconductor substrate further includes a first isolation section between adjacent pixels and a second isolation section between adjacent photoelectric converters. With this configuration, an inversion region (or a weak inversion region) is formed between adjacent photoelectric converters near the first surface as necessary. This makes it possible to improve imaging performance.

(1)

An imaging device including:

a semiconductor substrate having a first surface and a second surface that are opposed to each other, and including a plurality of pixels and a plurality of photoelectric converters, the plurality of pixels disposed in a matrix, and the plurality of photoelectric converters that generates, through photoelectric conversion, an electric charge corresponding to an amount of received light for each of the pixels;

a first isolation section that is provided between adjacent pixels of the pixels and electrically and optically isolates the adjacent pixels from each other;

a second isolation section that is provided between adjacent photoelectric converters in the pixel of the photoelectric converters and electrically isolates the adjacent photoelectric converters from each other; and an electrode layer provided on side of the first surface of the semiconductor substrate to extend over adjacent photoelectric converters of the photoelectric converters.

(2)

The imaging device according to (1), in which the electrode layer is provided over an entire surface of each of the pixels.

(3)

The imaging device according to (1) or (2), in which the electrode layer includes a first electrode layer and a second electrode layer, the first electrode layer being provided to extend over the adjacent photoelectric converters, and the second electrode layer being provided to extend over the adjacent pixels.

(4)

The imaging device according to any one of (1) to (3), in which the semiconductor substrate includes a pixel section in which the plurality of pixels is disposed in a matrix, and the electrode layer is provided over an entire surface of the pixel section.

(5)

The imaging device according to any one of (1) to (3), in which

32 the semiconductor substrate includes a pixel section in which the plurality of pixels is disposed in a matrix, and the electrode layer is provided for the plurality of pixels.

(6)

The imaging device according to any one of (1) to (3), in which the semiconductor substrate includes a pixel section in which the plurality of pixels is disposed in a matrix, and the electrode layer is provided for each of the pixels.

(7)

The imaging device according to any one of (1) to (6), in which the semiconductor substrate includes a pixel section in which the plurality of pixels is disposed in a matrix, and a potential is applied to the electrode layer in a peripheral region around the pixel section.

(8)

The imaging device according to any one of (1) to (7), in which the first isolation section and the second isolation section extend from the second surface toward the first surface of the semiconductor substrate.

(9)

The imaging device according to (8), in which the first isolation section penetrates through the semiconductor substrate between the first surface and the second surface.

(10)

The imaging device according to (8) or (9), in which the second isolation section has an end surface within the semiconductor substrate, and includes the semiconductor substrate between the end surface and the first surface.

(11)

The imaging device according to (9) or (10), in which the electrode layer is electrically coupled to the first isolation section.

(12)

The imaging device according to (11), in which a potential is applied to the electrode layer through the electrically coupled first isolation section.

(13)

The imaging device according to any one of (1) to (12), in which the second isolation section includes an impurity diffusion layer.

(14)

The imaging device according to any one of (1) to (13), in which a first bias is applied to the electrode layer upon accumulating an electric charge, and a second bias in a direction opposite to the first bias is applied to the electrode layer upon readout.

(15)

The imaging device according to any one of (1) to (14), further including a multi-layer wiring layer on side of the second surface of the semiconductor substrate.

(16)

The imaging device according to any one of (1) to (15), in which the first isolation section and the second isolation section each include an electrically conductive film having a light shielding property, and a wiring line provided on side of the second surface of the semiconductor substrate is electrically coupled to the electrically conductive film provided in the first isolation section.

(17)

The imaging device according to any one of (3) to (16), in which the semiconductor substrate further includes an impurity layer that is electrically coupled to the second electrode layer on the first surface, a potential of the impurity layer being controlled through the second electrode layer.

(18)

The imaging device according to (17), in which the first isolation section penetrates through the semiconductor substrate between the first surface and the second surface, and the impurity layer is provided along a side surface of the second isolation section, and includes a first impurity layer and a second impurity layer, the first impurity layer being provided in proximity to the first surface of the semiconductor substrate on the side surface of the second isolation section, and the second impurity layer being provided between the second surface of the semiconductor substrate and the first impurity layer and having an impurity concentration lower than the first impurity layer.

(19)

The imaging device according to (17) or (18), in which the first isolation section extends from the second surface toward the first surface of the semiconductor substrate, and has a bottom surface within the semiconductor substrate, and the impurity layer includes a first impurity layer and a second impurity layer, the first impurity layer being provided between the first surface of the semiconductor substrate and the bottom surface of the first isolation section, and the second impurity layer being provided between the second surface of the semiconductor substrate and the first impurity layer and having an impurity concentration lower than the first impurity layer.

(20)

An electronic apparatus provided with an imaging device, the imaging device including:

a semiconductor substrate having a first surface and a second surface that are opposed to each other, and including a plurality of pixels and a plurality of photoelectric converters, the plurality of pixels disposed in a matrix, and the plurality of photoelectric converters that generates, through photoelectric conversion, an electric charge corresponding to an amount of received light for each of the pixels;

a first isolation section that is provided between adjacent pixels of the pixels and electrically and optically isolates the adjacent pixels from each other;

a second isolation section that is provided between adjacent photoelectric converters in the pixel of the photoelectric converters and electrically isolates the adjacent photoelectric converters from each other; and an electrode layer provided on side of the first surface of the semiconductor substrate to extend over adjacent photoelectric converters of the photoelectric converters.

This application claims the priority on the basis of Japanese Patent Application No. 2021-039261 filed on Mar. 11, 2021 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a semiconductor substrate having a first surface and a second surface, wherein the first surface of the semiconductor substrate is opposite to the second surface of the semiconductor substrate, the semiconductor substrate includes a plurality of pixels and a plurality of photoelectric converters, the plurality of pixels is in a matrix, and the plurality of photoelectric converters generate, through photoelectric conversion, an electric charge corresponding to an amount of received light for each of the plurality of pixels;

a first isolation section between adjacent pixels of the plurality of pixels, wherein the first isolation section electrically and optically isolates the adjacent pixels;

a second isolation section between adjacent photoelectric converters of the plurality of photoelectric converters in a unit pixel of the plurality of pixels, wherein the second isolation section electrically isolates the adjacent photoelectric converters; and an electrode layer on a side of the first surface of the semiconductor substrate to extend over the adjacent photoelectric converters of the plurality of photoelectric converters, wherein the first isolation section and the second isolation section extend from the second surface toward the first surface of the semiconductor substrate, the first isolation section penetrates through the semiconductor substrate between the first surface and the second surface, and the electrode layer is electrically coupled to the first isolation section.

2. The imaging device according to claim 1, wherein the electrode layer is over an entire surface of each of the plurality of pixels.

3. The imaging device according to claim 1, wherein the electrode layer includes a first electrode layer and a second electrode layer, the first electrode layer extends over the adjacent photoelectric converters, and the second electrode layer extends over the adjacent pixels.

4. The imaging device according to according to claim 3, wherein the semiconductor substrate further includes an impurity layer that is electrically coupled to the second electrode layer on the first surface, and a potential of the impurity layer is controlled through the second electrode layer.

5. The imaging device according to claim 4, wherein the impurity layer is along a side surface of the second isolation section, the impurity layer includes a first impurity layer and a second impurity layer, the first impurity layer is in proximity to the first surface of the semiconductor substrate on the side surface of the second isolation section, the second impurity layer is between the second surface of the semiconductor substrate and the first impurity layer, and an impurity concentration of the second impurity layer is lower than an impurity concentration of the first impurity layer.

6. The imaging device according to claim 4, wherein the first isolation section has a bottom surface within the semiconductor substrate, the impurity layer includes a first impurity layer and a second impurity layer,

the first impurity layer is between the first surface of the
semiconductor substrate and the bottom surface of the
first isolation section,
the second impurity layer is between the second surface of
the semiconductor substrate and the first impurity layer,
and
an impurity concentration of the second impurity layer is
lower than an impurity concentration of the first impu-
rity layer.

7. The imaging device according to claim 1, wherein
the semiconductor substrate further includes a pixel sec-
tion in which the plurality of pixels is in the matrix, and
the electrode layer is over an entire surface of the pixel
section.

8. The imaging device according to claim 1, wherein
the semiconductor substrate further includes a pixel sec-
tion in which the plurality of pixels is in the matrix, and
the electrode layer is for the plurality of pixels.

9. The imaging device according to claim 1, wherein
the semiconductor substrate further includes a pixel sec-
tion in which the plurality of pixels is in the matrix, and
the electrode layer is for each of the plurality of pixels.

10. The imaging device according to claim 1, wherein
the semiconductor substrate further includes a pixel sec-
tion in which the plurality of pixels is in the matrix, and
a potential is applied to the electrode layer in a peripheral
region around the pixel section.

11. The imaging device according to claim 1, wherein
the second isolation section has an end surface within the
semiconductor substrate, and
includes the semiconductor substrate between the end
surface and the first surface.

12. The imaging device according to claim 1, wherein a
potential is applied to the electrode layer through the elec-
trically coupled first isolation section.

13. The imaging device according to claim 1, wherein the
second isolation section includes an impurity diffusion layer.

14. The imaging device according to claim 1, wherein
a first bias is applied to the electrode layer upon accu-
mulation of the electric charge, and
a second bias, in a direction opposite to the first bias, is
applied to the electrode layer upon readout.

15. The imaging device according to claim 1, further
comprising a multi-layer wiring layer on a side of the second
surface of the semiconductor substrate.

16. The imaging device according to claim 1, wherein
each of the first isolation section and the second isolation
section includes an electrically conductive film having
a light shielding property, and
a wiring line on a side of the second surface of the
semiconductor substrate is electrically coupled to the
electrically conductive film provided in the first isola-
tion section.

17. An electronic apparatus, comprising:
an imaging device that includes:
a semiconductor substrate having a first surface and a
second surface, wherein
the first surface of the semiconductor substrate is
opposite to the second surface of the semiconduc-
tor substrate,
the semiconductor substrate includes a plurality of
pixels and a plurality of photoelectric converters,
the plurality of pixels is in a matrix, and
the plurality of photoelectric converters generate,
through photoelectric conversion, an electric
charge corresponding to an amount of received
light for each of the plurality of pixels;
a first isolation section between adjacent pixels of the
plurality of pixels, wherein the first isolation section
electrically and optically isolates the adjacent pixels;
a second isolation section between adjacent photoelec-
tric converters of the plurality of photoelectric con-
verters in a unit pixel of the plurality of pixels,
wherein the second isolation section electrically iso-
lates the adjacent photoelectric converters; and
an electrode layer on a side of the first surface of the
semiconductor substrate to extend over the adjacent
photoelectric converters of the plurality of photo-
electric converters, wherein
the first isolation section and the second isolation
section extend from the second surface toward the
first surface of the semiconductor substrate,
the first isolation section penetrates through the
semiconductor substrate between the first surface
and the second surface, and
the electrode layer is electrically coupled to the first
isolation section.

* * * * *